(12) United States Patent
Pengelly

(10) Patent No.: US 7,368,971 B2
(45) Date of Patent: May 6, 2008

(54) HIGH POWER, HIGH FREQUENCY SWITCH CIRCUITS USING STRINGS OF POWER TRANSISTORS

(75) Inventor: Raymond Sydney Pengelly, Hillsborough, NC (US)

(73) Assignee: Cree, Inc., Durham, NC (US)

( * ) Notice: Subject to any disclaimer, the term of this patent is extended or adjusted under 35 U.S.C. 154(b) by 85 days.

(21) Appl. No.: 11/295,060

(22) Filed: Dec. 6, 2005

(65) Prior Publication Data

US 2007/0126492 A1    Jun. 7, 2007

(51) Int. Cl.
*H04B 1/44* (2006.01)
(52) U.S. Cl. .................. 327/430; 333/103; 333/104
(58) Field of Classification Search ............... 327/365, 327/427, 437, 377, 376, 430, 408; 333/262, 333/81 R, 103, 104
See application file for complete search history.

(56) References Cited

U.S. PATENT DOCUMENTS

| 4,757,028 | A | | 7/1988 | Kondoh et al. |
|---|---|---|---|---|
| 4,762,806 | A | | 8/1988 | Suzuki et al. |
| 4,929,855 | A | * | 5/1990 | Ezzeddine .................. 327/427 |
| 5,012,123 | A | * | 4/1991 | Ayasli et al. ................ 307/112 |
| 5,081,706 | A | * | 1/1992 | Kim ........................... 455/78 |
| 5,192,987 | A | | 3/1993 | Khan et al. |
| 5,270,554 | A | | 12/1993 | Palmour |
| 5,296,395 | A | | 3/1994 | Khan et al. |
| 5,666,089 | A | | 9/1997 | Ehlers |
| 5,818,283 | A | * | 10/1998 | Tonami et al. ............... 327/436 |
| 5,925,895 | A | | 7/1999 | Sriram et al. |
| 5,990,580 | A | | 11/1999 | Weigand |
| 6,316,793 | B1 | | 11/2001 | Sheppard et al. |
| 6,548,333 | B2 | | 4/2003 | Smith |
| 6,686,616 | B1 | | 2/2004 | Allen et al. |
| 6,849,882 | B2 | | 2/2005 | Chavarkar et al. |
| 6,906,350 | B2 | | 6/2005 | Sriram |
| 6,956,239 | B2 | | 10/2005 | Sriram |
| 2003/0020092 | A1 | | 1/2003 | Parikh et al. |
| 2003/0132814 | A1 | | 7/2003 | Nyberg |
| 2004/0061129 | A1 | | 4/2004 | Saxler et al. |

OTHER PUBLICATIONS

Communication with European Search Report, EP Application No. 06124121.2, Mar. 21, 2007.
Umeda et al. "Novel Direct-Coupled Current Switch Architecture for a Series-Connected Voltage-Balancing Pulse Driver" *2003 IEEE MTT-S International Microwave Symposium Digest*, Philadelphia, PA, vol. 3, Jun. 8-13, 2003, pp. 2265-2268.

(Continued)

*Primary Examiner*—Dinh T. Le
(74) *Attorney, Agent, or Firm*—Myers Bigel Sibley & Sajovec, P.A.

(57) ABSTRACT

High power, high frequency switches include a transmission line having at least three portions that are serially coupled between an input port and an output port to define at least two nodes and to carry a high power, high frequency signal between the input port and the output port. First and second power transistors are provided. At least a third power transistor also is provided. The controlling electrode(s) (gate) of the first, second and/or third power transistor(s) are responsive to a switch control input. The controlled electrodes (source/drain) of a respective one of the first and second power transistors, and of a respective one of the third power transistor(s) are serially coupled between a respective one of the at least two nodes and a reference voltage. The power transistors may be silicon carbide MESFETs.

22 Claims, 22 Drawing Sheets

OTHER PUBLICATIONS

U.S. Appl. No. 11/157,356, filed Jun. 21, 2005, Sriram.
U.S. Appl. No. 11/118,575, filed Apr. 29, 2005, Saxler.
U.S. Appl. No. 11/118,675, filed Apr. 29, 2005, Saxler.
U.S. Appl. No. 11/012,553, filed Dec. 15, 2004, Sriram.
U.S. Appl. No. 10/977,054, filed Oct. 29, 2004, Sriram et al.
U.S. Appl. No. 10/977,227, filed Oct. 29, 2004, Sriram et al.

* cited by examiner

Voltage at Stacked FET nodes in Switch "Off" State

HIGH POWER, HIGH FREQUENCY SWITCH CIRCUITS USING STRINGS OF POWER TRANSISTORS

FIELD OF THE INVENTION

This invention relates to electronic circuits, and more particularly to electronic switch circuits.

BACKGROUND OF THE INVENTION

Electronic switch circuits are widely used to switch high power (for example, at least 20 watts) at high frequencies (for example in the range of MHz and beyond). Semiconductor device manufacturers have developed transistors that are capable of operating at high frequencies and are still capable of handling higher power loads. For example, metal semiconductor field effect transistors (MESFETS) have been developed for high frequency, high power applications. High power, high frequency MESFETs have been fabricated from semiconductor materials including gallium arsenide, silicon carbide and/or gallium nitride.

In order to provide a high power, high frequency switch, one or more power transistors, such as MESFETs, are connected into a circuit. It is desirable for such circuits to have a high power handling ability over a range of high frequencies, to provide relatively large isolation of the high power signal when in the "off" state, and relatively low resistance when in the "on" state.

SUMMARY OF THE INVENTION

High power, high frequency switches according to some embodiments of the present invention include a transmission line having at least three portions that are serially coupled between an input port and an output port, to define at least two nodes therebetween, and to carry a high power, high frequency signal between the input port and the output port. First and second power transistors are provided, each including a controlling electrode and controlled electrodes. At least a third power transistor also is provided, including a controlling electrode and controlled electrodes. The controlled electrodes of a respective one of the first and second power transistors and of a respective one of the at least a third power transistor are serially coupled between a respective one of the at least two nodes and a reference voltage. The controlling electrodes of the first, second and/or at least a third power transistor are responsive to a switch control input. In some embodiments, the first, second and the at least a third power transistor are operable to shunt the first and second nodes to the reference voltage, and to decouple from the nodes, in response to the switch control signal.

In some embodiments, the at least a third power transistor comprises a third and a fourth power transistor. The controlled electrodes of the first and third power transistors are serially connected between the first node and the reference voltage, and the controlled electrodes of the second and fourth power transistors are serially connected between the second node and the reference voltage.

In still other embodiments, the at least a third power transistor consists of a third power transistor. The controlled electrodes of a respective one of the first and second power transistors and the third power transistor are serially coupled between the respective one of the at least two nodes and the reference voltage.

In some embodiments, the transmission line comprises an actual transmission line including the at least three portions.

The transmission line may include strip lines, coaxial lines and/or other conventional transmission lines. In other embodiments, the transmission line comprises an artificial transmission line that is formed of, for example, distributed series inductors and distributed shunt capacitors. In some embodiments, the shunt capacitors comprise parasitic capacitance of the first and second power transistors.

High power, high frequency switches according to other embodiments of the present invention include a signal line that carries a high power, high frequency signal between an input port and an output port, and a plurality of strings of serially connected power transistors. A respective string of serially connected power transistors is connected between the signal line and a reference voltage, and is responsive to a switch control signal. In some embodiments, the plurality of strings of serially connected power transistors are operable to shunt to the signal line to the reference voltage, and to decouple from the signal line, in response to the switch control signal.

In some embodiments, the above-described power transistors are embodied as silicon carbide MESFETs. Moreover, in some embodiments, the above-described circuits are configured to provide at least 50 watts of power handling at less than 0.25 dB compression, an isolation of at least 32 dB and an effective on resistance of less than 0.5 ohm over a frequency range of from about 20 MHz to about 200 MHz. In other embodiments, the above-described circuits are configured to provide at least 50 watts of power handling at less than 0.3 dB compression, an isolation of at least 45 dB and an effective on resistance of less than 0.5 ohm over a frequency range from about 500 MHz to about 1000 MHz.

DETAILED DESCRIPTION

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Moreover, each embodiment described and illustrated herein includes its complementary conductivity type embodiment as well. Like numbers refer to like elements throughout.

It will be understood that when an element is referred to as being "connected", "coupled", "responsive" or "in response to" another element, it can be directly connected, responsive or in response to the other element or intervening elements may be present. In contrast, the term "directly" means there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first transistor could be termed a second transistor, and, similarly, a second transistor could be termed a first transistor without departing from the teachings of the disclosure.

The terminology used herein is for the purpose -of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof. In contrast, the phrase "the at least a third power transistor consists of a third power transistor", when used in the specification, specifies that only a single third power transistor is provided.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1:
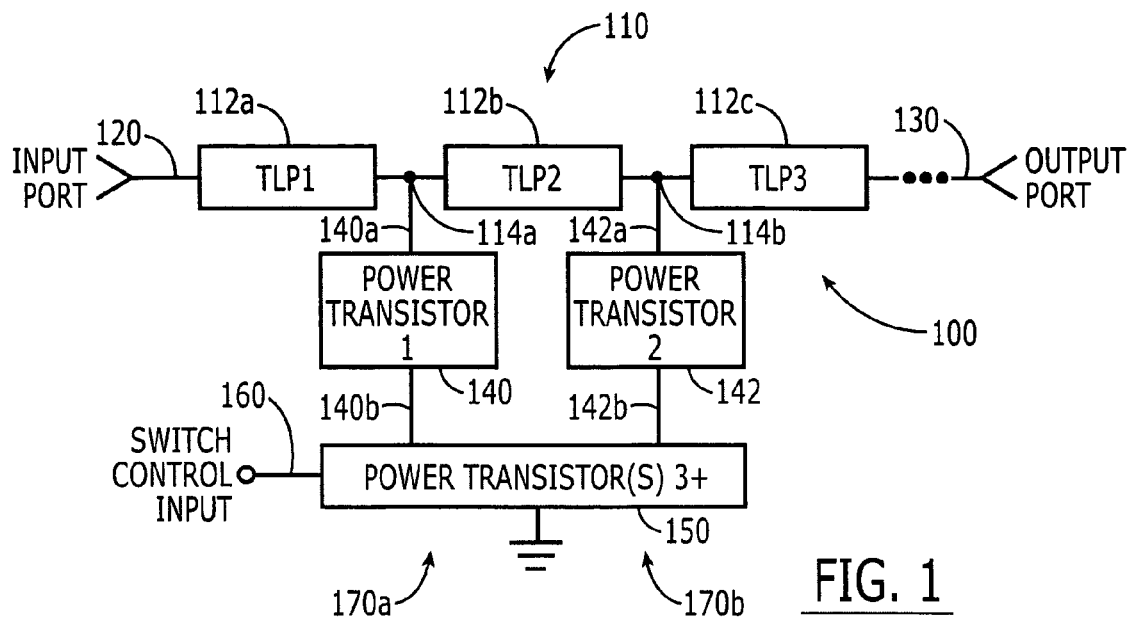
FIG. 1 is a block diagram of a high power, high frequency switch according to various embodiments of the present invention.

FIG. 1 is a block diagram of a high power, high frequency switch according to various embodiments of the present invention. As shown in FIG. 1, these embodiments of high power, high frequency switch 100 include a transmission line 110 including at least three transmission line portions 112a-112c that are serially coupled between an input port 120 and an output port 130 to define at least two nodes 114a, 114b therebetween. The transmission line portions 112a-112c are also labeled TLP1-TLP3 in FIG. 1. The transmission line 110 carries the high power, high frequency signal between the input port 120 and the output port 130, in either or both directions.

Still referring to FIG. 1, first and second power transistors 140, 142, respectively, include a controlling electrode, such as a gate or base, and controlled electrodes, such as source/drain or emitter/collector electrodes. At least a third power transistor 150 also is provided, including a controlling electrode and controlled electrodes. As illustrated in FIG. 1, the controlled electrodes of a respective one of the first and second transistors 140, 142, and of a respective one of the at least a third transistor 150, are serially coupled between a respective one of the at least two nodes 114a, 114b, and a reference voltage, shown as ground voltage. The serial coupling of a respective power transistor 140, 142 to a respective node 114a, 114b is indicated by respective connections 140a, 142a. Moreover, the respective serial coupling between a controlled electrode of the first and second power transistors 140, 142 with the at least a third power transistor 150 is indicated by the connections 140b, 142b in FIG. 1.

Still referring to FIG. 1, the controlling electrodes of the first power transistor 140, second power transistor 142 and/or at least a third power transistor 150 is responsive to a switch control input 160. In some embodiments, as shown in FIG. 1, the controlling electrodes of the at least a third power transistor 150 are responsive to the switch control input 160. In other embodiments, the controlling electrodes of the first power transistor 140 and/or second power transistor 142 is responsive to the switch control input. In still other embodiments, the first power transistor 140, second power transistor 142 and at least a third power transistor 150 are all responsive to the switch control input 160. A given power transistor may be directly responsive to the switch control input 160 or may be indirectly responsive to the switch control input 160, for example by way of a voltage divider or other circuit.

Figure 2:
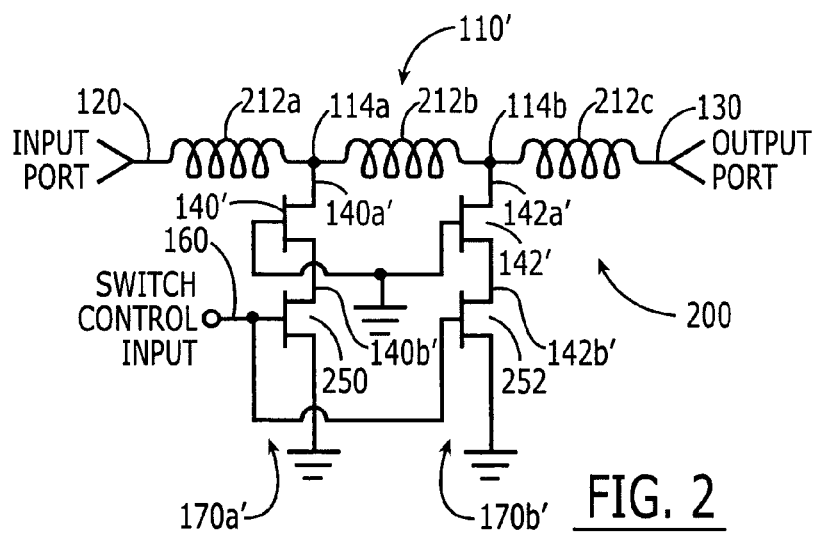
FIGS. 2 and 3 are circuit diagrams of high power, high frequency switches according to various embodiments of the present invention.

FIG. 2 is a circuit diagram of a high power, high frequency switch according to other embodiments of the present invention. As shown in FIG. 2, in these switches 200, the transmission line 110' comprises an artificial transmission line that includes distributed series inductors 212a-212c, and distributed shunt capacitors. In FIG. 2, the distributed shunt capacitors may be provided by the parasitic capacitance of the first and second power transistors 140', 142', by parasitic capacitances of the interconnections 140a', 142a' and/or by discrete capacitors. Moreover, in some embodiments of FIG. 2, the first and second power transistors 140', 142' are metal semiconductor field effect transistors (MESFETs) and, in some embodiments, silicon carbide-based MESFETS. Also in FIG. 2, the at least a third power transistor 150 of FIG. 1 comprises a third power transistor 250 and a fourth power transistor 252. As shown in FIG. 2, in these embodiments, the third and fourth power transistors 250, 252 include controlling electrodes (gates) that are responsive to the switch control input. Moreover, the controlled electrodes (source/drain) of the first and third power transistors 140' and 250 are serially connected between the first node 114a and the reference voltage (here ground), as shown by the connections 140a', 140b'. Finally, the controlled electrodes of the second and fourth power transistors 142', 252 are serially connected between the second node 114b and the reference voltage, as shown by the connections 142a', 142b'. In FIG. 2, the third and fourth power transistors may also be embodied as MESFETs and, in some embodiments, as silicon carbide-based MESFETs.

Figure 3:
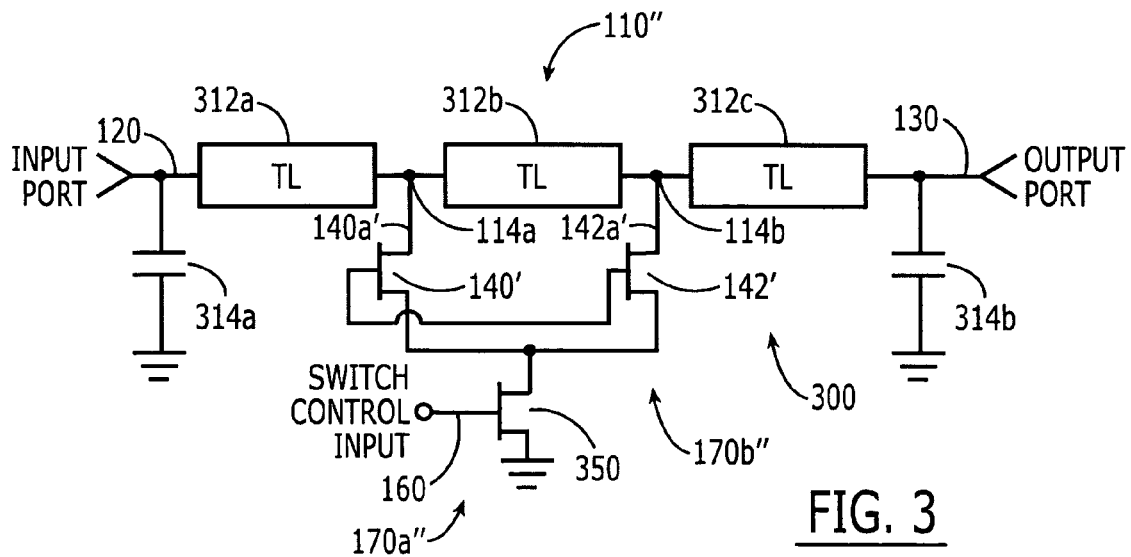

FIG. 3 illustrates yet other embodiments of the present invention. In a high power, high frequency switch 300 of FIG. 3, the transmission line 110" comprises an actual transmission line including at least three transmission lines 312a, 312b, 312c. Discrete shunt capacitors 314a, 314b also may be provided. Moreover, in embodiments of FIG. 3, the at least a third power transistor 150 of FIG. 1 consists of a single power transistor 350 including a controlling electrode that is responsive to the switch control input 160. As shown in FIG. 3, the controlled electrodes of a respective one of the first and second transistors 140', 142' and of the third transistor 350 are serially coupled between a respective one of the at least two nodes 114a, 114b and the reference voltage, here ground.

It will be understood by those having skill in the art that various embodiments of FIGS. 1-3 may be combined in various combinations and subcombinations. For example, a single third power transistor 350 and/or multiple third power transistors 250, 252 may be used with any of the embodiments. Moreover, an artificial transmission line 110' and/or an actual transmission line 110'' may be used with any of the embodiments. The switch control input 160 may also be connected to the first and second power transistors 140, 142, 140', 142' directly and/or via a resistive divider or other circuit. In some embodiments, the first, second and at least a third power transistors are operable to shunt the first and second nodes 114a, 114b to the reference voltage, such as ground, and to decouple from the nodes 114a, 114b, in response to the switch control input 160.

High power, high frequency switches according to exemplary embodiments of the present invention may also be regarded as including a signal line 110, 110', 110'' that carries a high power, high frequency signal between an input port 120 and an output port 130. A plurality of strings 170a, 170b (FIG. 1); 170a', 170b' (FIG. 2); and 170a'', 170b'' (FIG. 3) are provided, a respective one of which is connected between the signal line 110, 110', 110'' and the reference voltage, and which are responsive to a switch control signal 160. The strings may include independent transistors, as illustrated in FIG. 2, or a given transistor may be shared by two or more strings, as illustrated in FIG. 3. Moreover, embodiments of FIGS. 1-3 include only two transistors in a given string. However, three or more transistors also may be stacked in a given string. Finally, only two strings are shown in FIGS. 1-3. However, more than two strings also may be provided in other embodiments of the present invention.

As was described above, the power transistors of FIGS. 1-3 may be embodied by MESFETs and, in some embodiments, by silicon carbide MESFETs. Silicon carbide MESFETs are known to those having skill in the art and are described, for example, in U.S. Pat. Nos. 4,762,806; 4,757,028; 5,270,554; 5,925,895; 6,686,616; 6,906,350 and 6,956,239, the disclosures of which are incorporated herein as if set forth fully. Also, devices such as those described in commonly assigned U.S. patent application Ser. No. 10/977,054, filed on Oct. 29, 2004 entitled Metal-Semiconductor Field Effect Transistors (MESFETs) Having Drains Coupled to the Substrate and Methods of Fabricating the Same; Ser. No. 10/977,227, filed on Oct. 29, 2004 entitled Asymetric Layout Structures for Transistors and Methods of Fabricating the Same; Ser. No. 11/012,553, filed on Dec. 15, 2004 entitled Transistors Having Buried N-Type and P-Type Regions Beneath the Source Regions and Methods of Fabricating the Same; and Ser. No. 11/157,356, filed on Jun. 21, 2005 entitled Semiconductor Devices Having Varying Electrode Widths to Provide Non-Uniform Gate Pitches and Related Methods, the disclosures of which are incorporated herein as if set forth fully, may be used in embodiments of the present invention. Gallium arsenide (GaAs) MESFETs and/or gallium nitride (GaN) MESFETs may be used. MESFETs formed of two or more of these materials also may be used.

Moreover, other high power and/or high frequency transistors, such as High Electron Mobility Transistors (HEMTs), also referred to as Modulation-Doped Field Effect Transistors (MODFETs), may be used. For example, HEMTs, as described in U.S. Pat. Nos. 5,192,987; 5,296,395; 6,316,793; 6,548,333; and 6,849,882 may be used. Other suitable structures for gallium nitride-based HEMTs are described, for example, in U.S. Patent Publication No. 2004/0061129 filed Jul. 11, 2003 and published Apr. 1, 2004 for Nitride-Based Transistors And Methods Of Fabrication Thereof Using Non-Etched Contact Recesses; U.S. Patent Publication No. 2003/0020092 filed Jul. 23, 2002 and published Jan. 30, 2003 for Insulating Gate AlGaN/GaN HEMT; U.S. application Ser. No. 11/118,575, filed Apr. 29, 2005 for Aluminum Free Group III-Nitride Based High Electron Mobility Transistors and Methods of Fabricating Same; and U.S. application Ser. No. 11/118,675, filed Apr. 29, 2005 for Binary Group III-Nitride Based High Electron Mobility Transistors and Methods of Fabricating Same; the disclosures of which are hereby incorporated herein by reference in their entirety.

Accordingly, some embodiments of the invention can employ pairs of silicon carbide MESFETs in an artificial/actual transmission line configuration, such that the drain and gate voltages on the MESFETs are changed to provide a low loss (or even some gain) "on" state or a high isolation "off" state. Stacked MESFETs may be used to increase or maximize radio frequency (RF) power handling ability at low frequencies, by providing the voltage swing across the gates of the devices. Suitable gate width FETs may be used to enable RF power handling with low compression. Some embodiments of the invention can provide a high power, high isolation switch covering a decade of bandwidth at relatively low current drive. Embodiments of the invention may also be compatible with standard Monolithic Microwave Integrated Circuit (MMIC) design practices, which can allow the potential integration of the switch configurations of embodiments of the present invention with other circuit elements, such as power amplifiers.

Conventionally, switches for the same levels of RF power handling capacities may employ PIN diodes, which may draw large amounts of current in their "on" states and may not be compatible with MMIC technology. In sharp contrast, some embodiments of the invention can use multiple FETs in an actual/artificial transmission line configuration and/or may employ stacked transistors to allow greater power handling capability, particularly at low frequencies, where the low parasitic capacitance of the transistors may not contribute to the effective voltage division between the gate and drain, and the gate and source.

Some embodiments of the present invention can provide a 20 MHz to 200 MHz single pole/single throw switch. Moreover, other embodiments of the invention can be scaled in power handling and/or frequency, to cover specific bandwidths. The single pole/single throw switch configuration also may provide a building block for many other switch configurations, such as multiple pole/multiple throw switches.

Embodiments of the invention can exhibit well behaved compression characteristics in the "on" state, where simulations indicate only 0.2 dB loss at 56 watts continuous wave power, as described below. Low switch loss at high power levels can be used to reduce or minimize dissipated power/heat, increase or maximize system efficiency, etc. Other embodiments of the present invention can replace the series inductors of FIG. 2 with actual transmission lines, as in FIG. 3. Actual transmission lines may be used in higher frequency applications, in some embodiments of the present invention.

As will be described in detail below, in some embodiments of the present invention, the transmission line 110,

110', 110", and the first, second and at least the third transistors 140, 142, 150 (FIG. 1); 140', 142', 250, 252 (FIG. 2); and/or 140', 142', 350 (FIG. 3) may be configured to provide at least 50 watts of power handling at less than 0.25 dB compression, an isolation of at least 32 dB and an effective on resistance of less than 0.5 ohm over a frequency range from about 20 MHz to about 200 MHz. In other embodiments, at least 50 watts of power handling is provided at less than 0.3 dB compression, an isolation of about 45 dB and an effective on resistance of less than 0.5 ohm over a frequency range from about 500 MHz to about 1000 MHz.

EXAMPLES

The following Examples shall be regarded as merely illustrative and shall not be construed as limiting the invention. Two embodiments of high power, high frequency switches were designed and simulated, as will be described in detail below. A conventional Harmonic Balance Nonlinear simulator, such as Applied Wave Research's "Microwave Office Version 6.53", was used to simulate these circuits.

Example 1

FIGS. 4-13 simulate a first high power, high frequency switch according to exemplary embodiments of the present invention. These embodiments are capable of more than 50 watts power handling at less than 0.25 dB compression. An isolation of at least 32 dB is provided over a bandwidth from about 20 MHz to about 200 MHz. The effective on resistance is less than about 0.5 ohm. These embodiments are implemented using an artificial transmission line with two pairs of silicon carbide MESFETs, to absorb the drain-to-source capacitance in shunt mode approach, as was illustrated schematically in FIG. 2. In some embodiments, stacked bare die silicon carbide MESFETs may be used to increase or maximize power handling ability at low frequencies.

Figure 4:
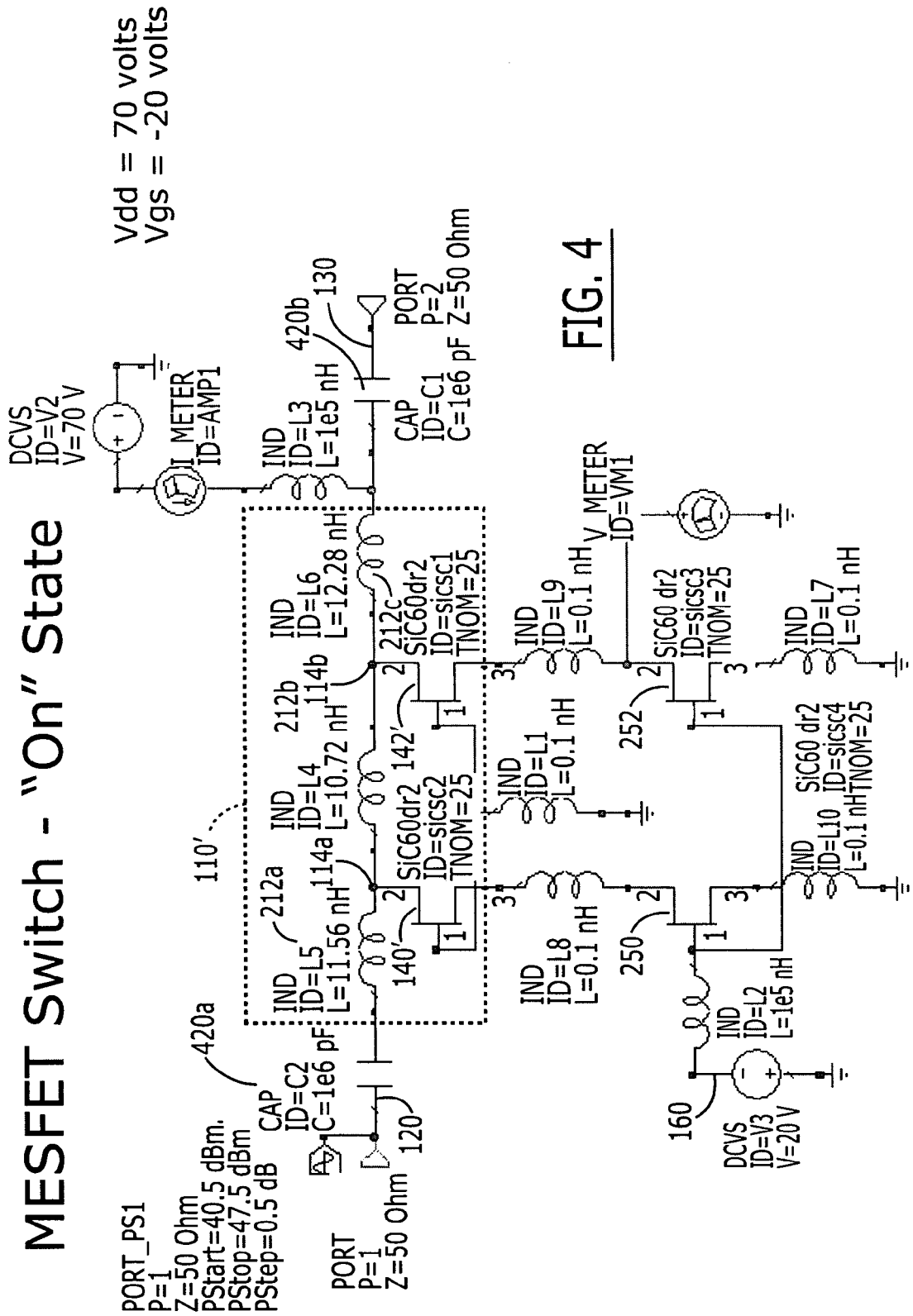
FIG. 4 is a circuit simulation of a high power, high frequency switch according to some embodiments of the present invention in the "on" state.

FIG. 4 illustrates a circuit simulation of the switch in the "on" state. Like numbers with FIG. 2 are used. DC blocking capacitors 420a, 420b are also shown. A switch control input voltage of –20 V and a power supply voltage of 70 V are shown. Parasitic inductors are also shown for purposes of the simulation.

Figure 5:
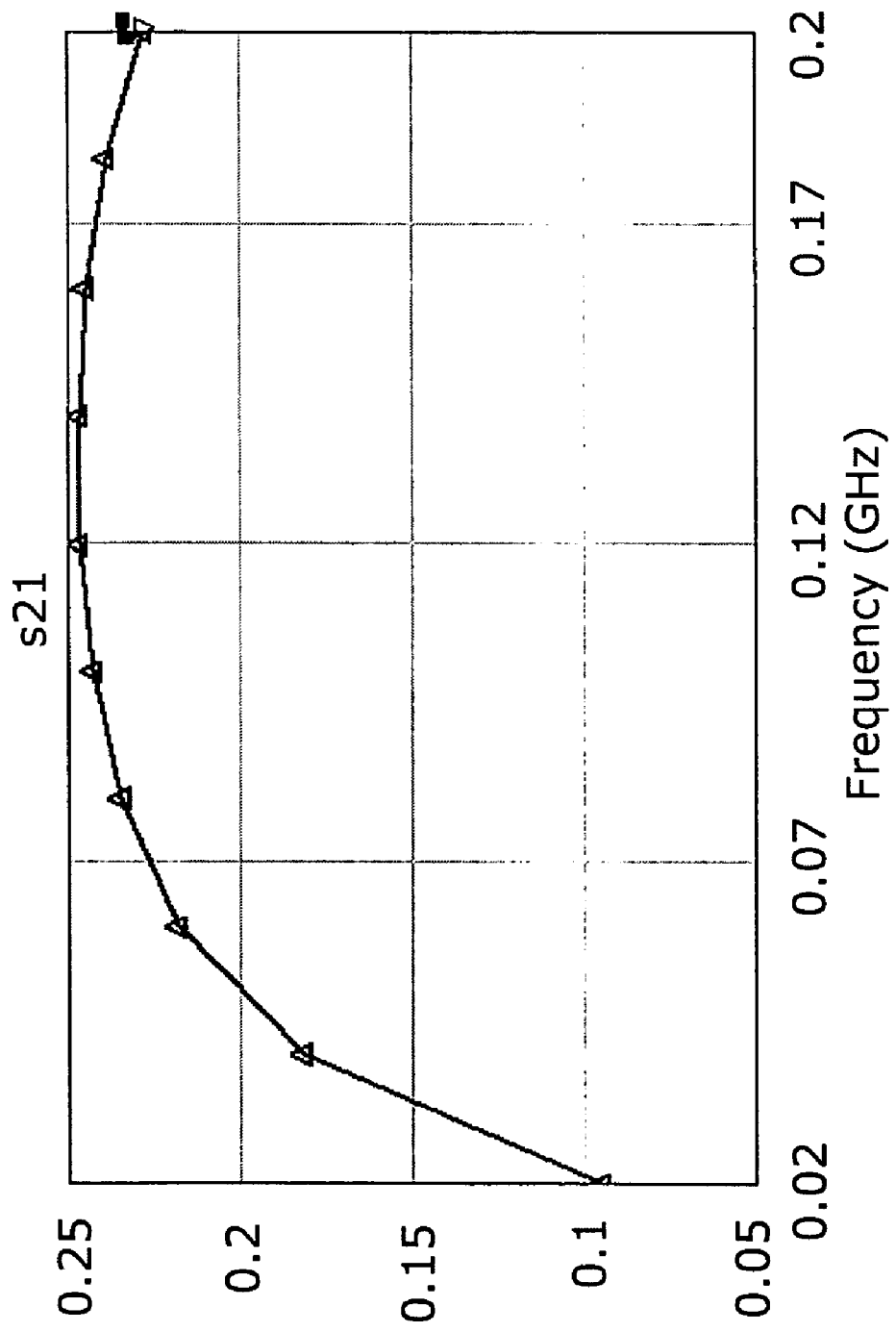
FIGS. 5-8 graphically illustrate simulation results for the circuit of FIG. 4.

FIG. 5 graphically illustrates simulated small signal insertion loss in the "on" state for the MESFET switch of FIG. 3. As shown, a loss of less than 0.25 dB is shown for frequencies between 20 MHz and 200 MHz.

Figure 6:
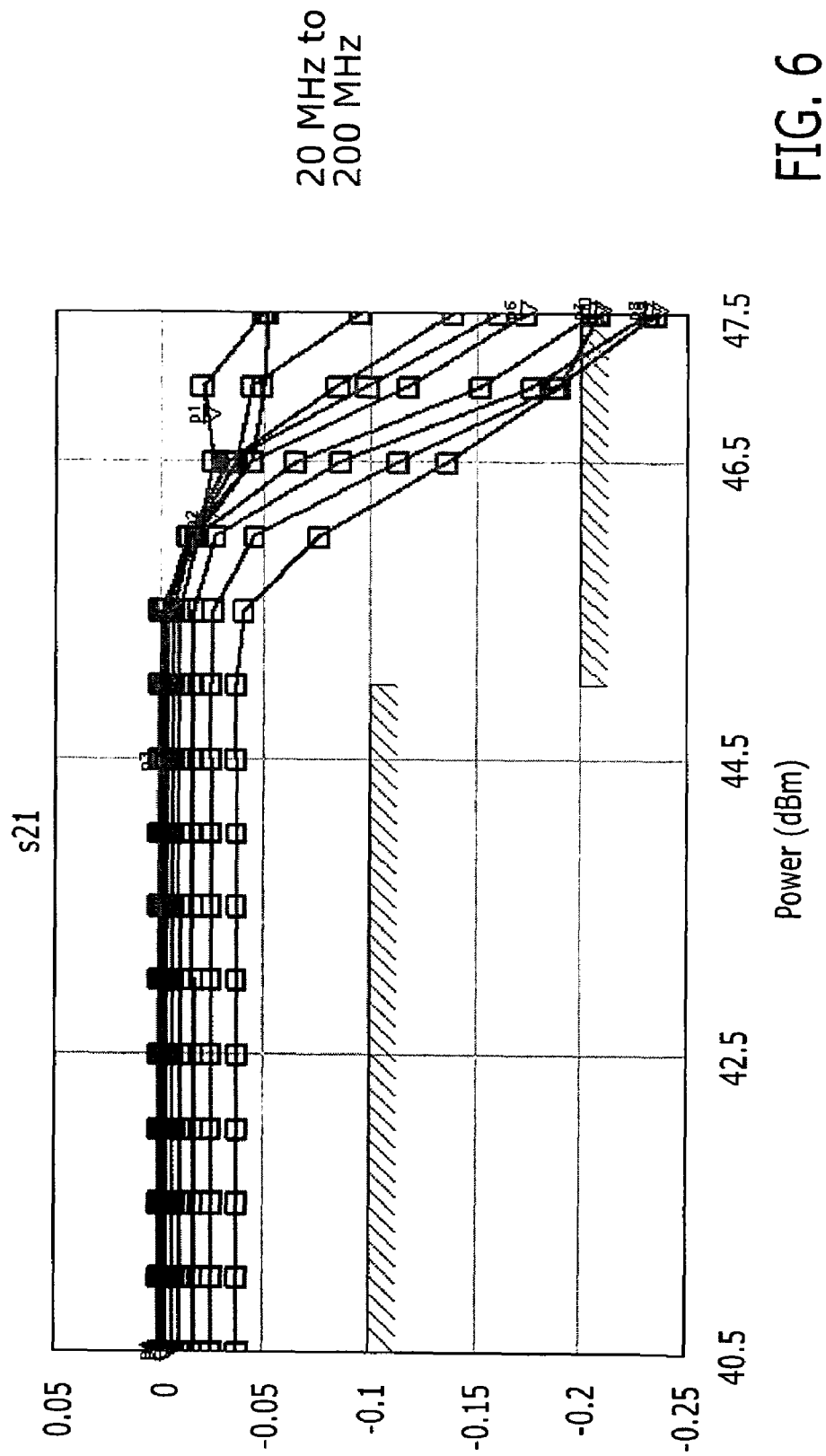
Figure 7:
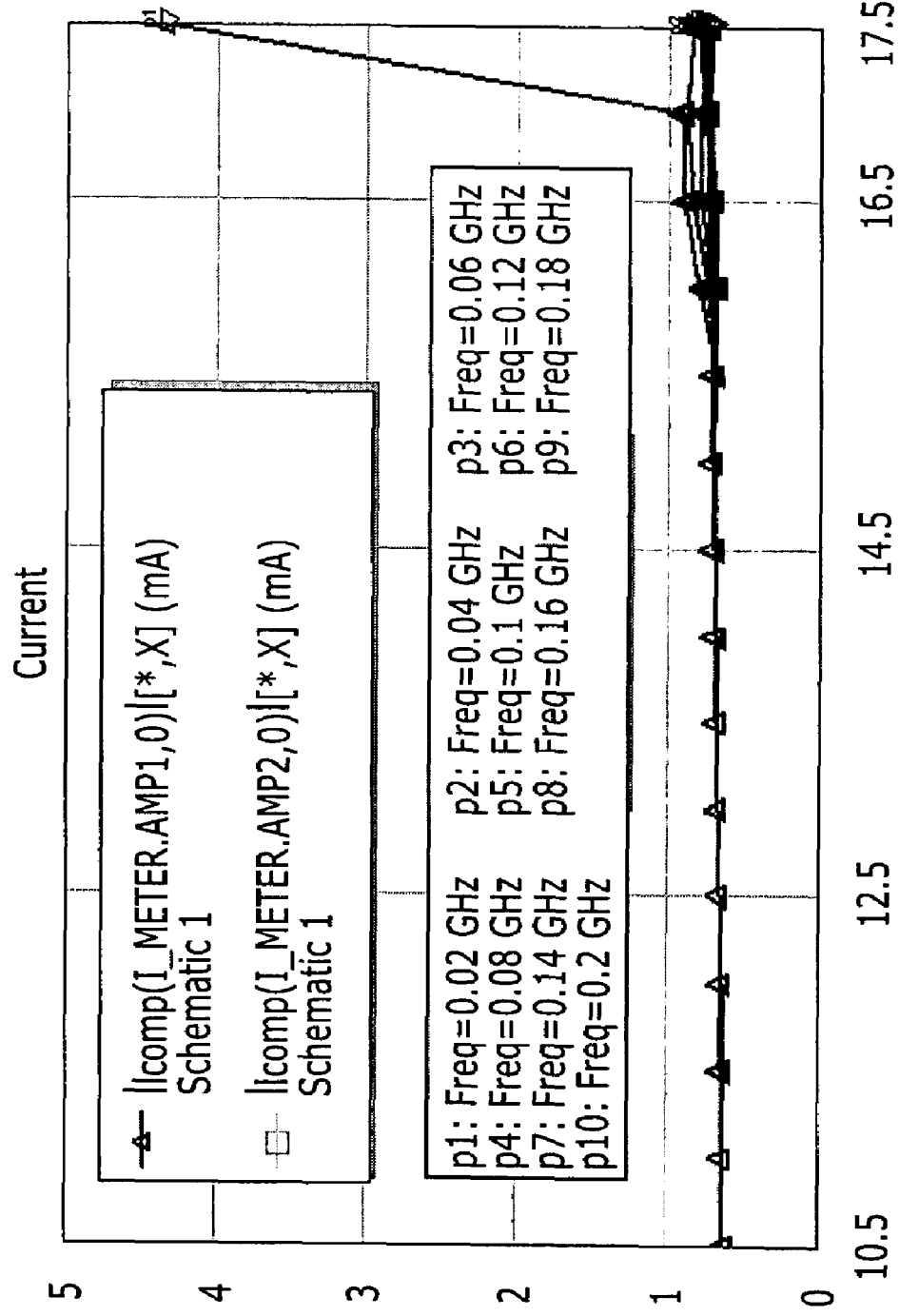
Figure 8:
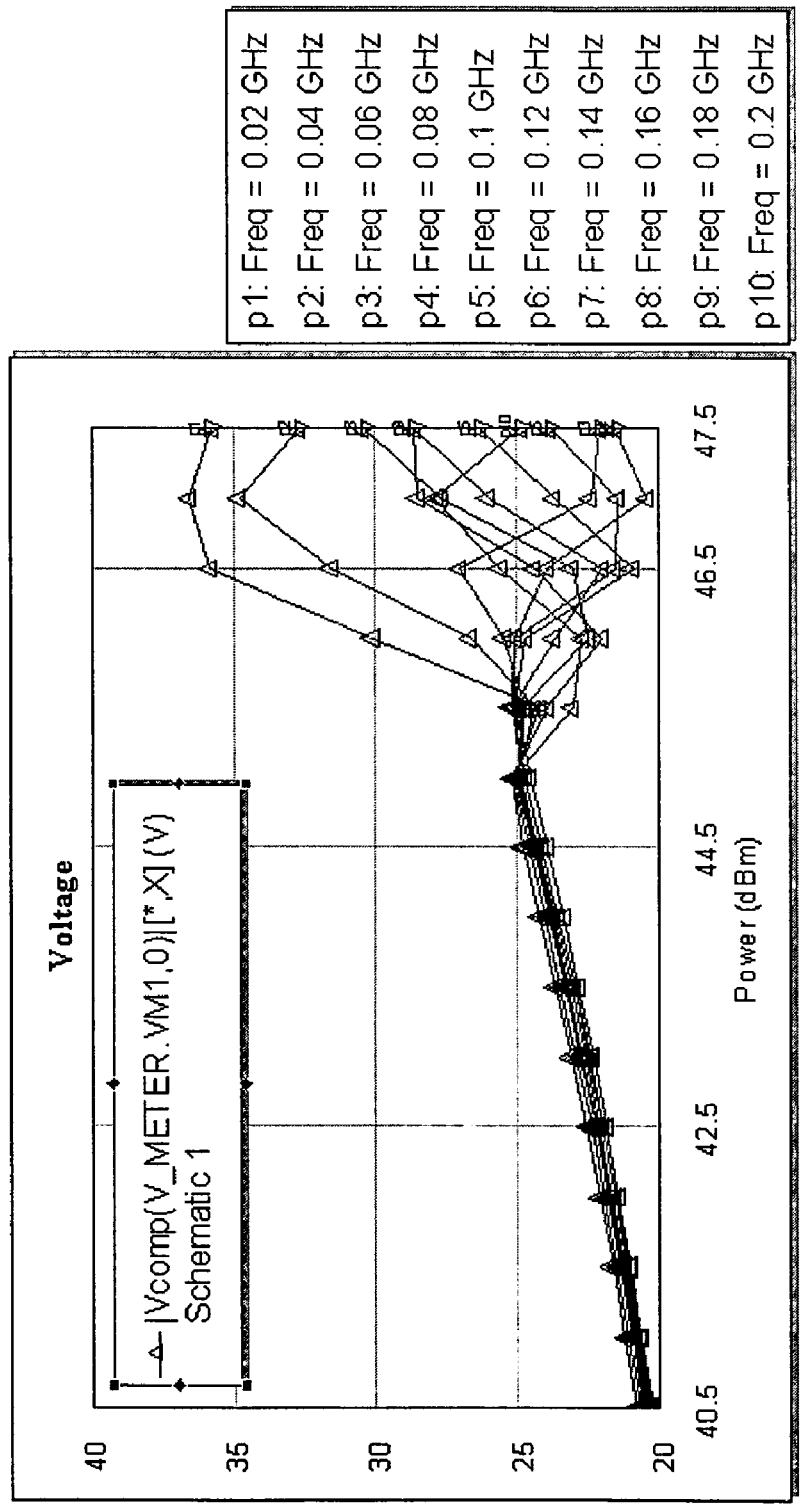

FIG. 6 illustrates simulated loss in the "on" state versus RF input power as a function of frequency. FIG. 7 illustrates simulated DC current in the "on" state versus RF input power and frequency. FIG. 8 illustrates the simulated voltage at the stacked FET nodes in the switch "on" state. In other words, FIG. 8 illustrates that the voltage across the first and second power transistors 140', 142' are less than 50 volts between drain and source.

Figure 9:
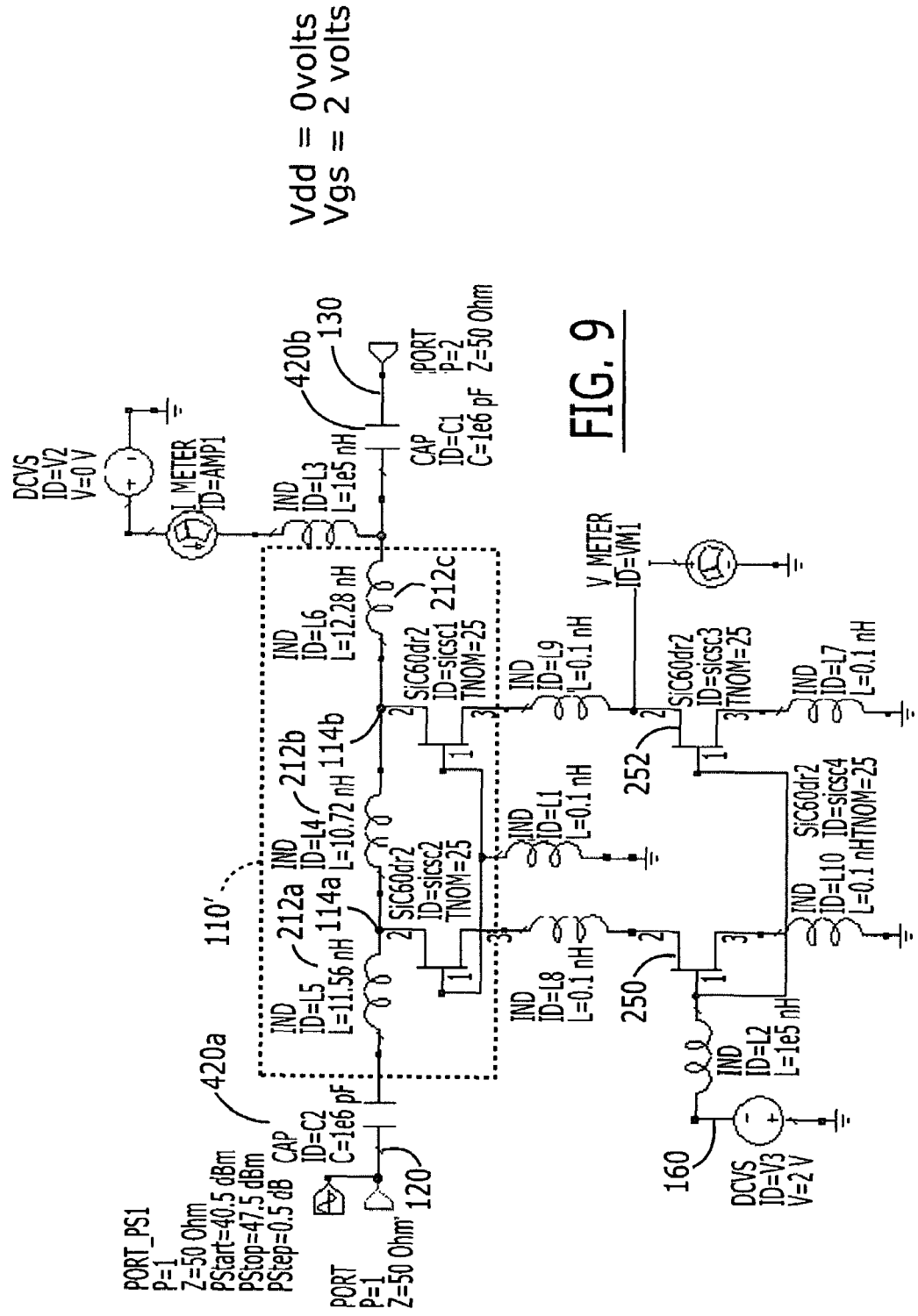
FIG. 9 is a circuit simulation of a high power, high frequency switch according to some embodiments of the present invention in the "off" state.
Figure 10:
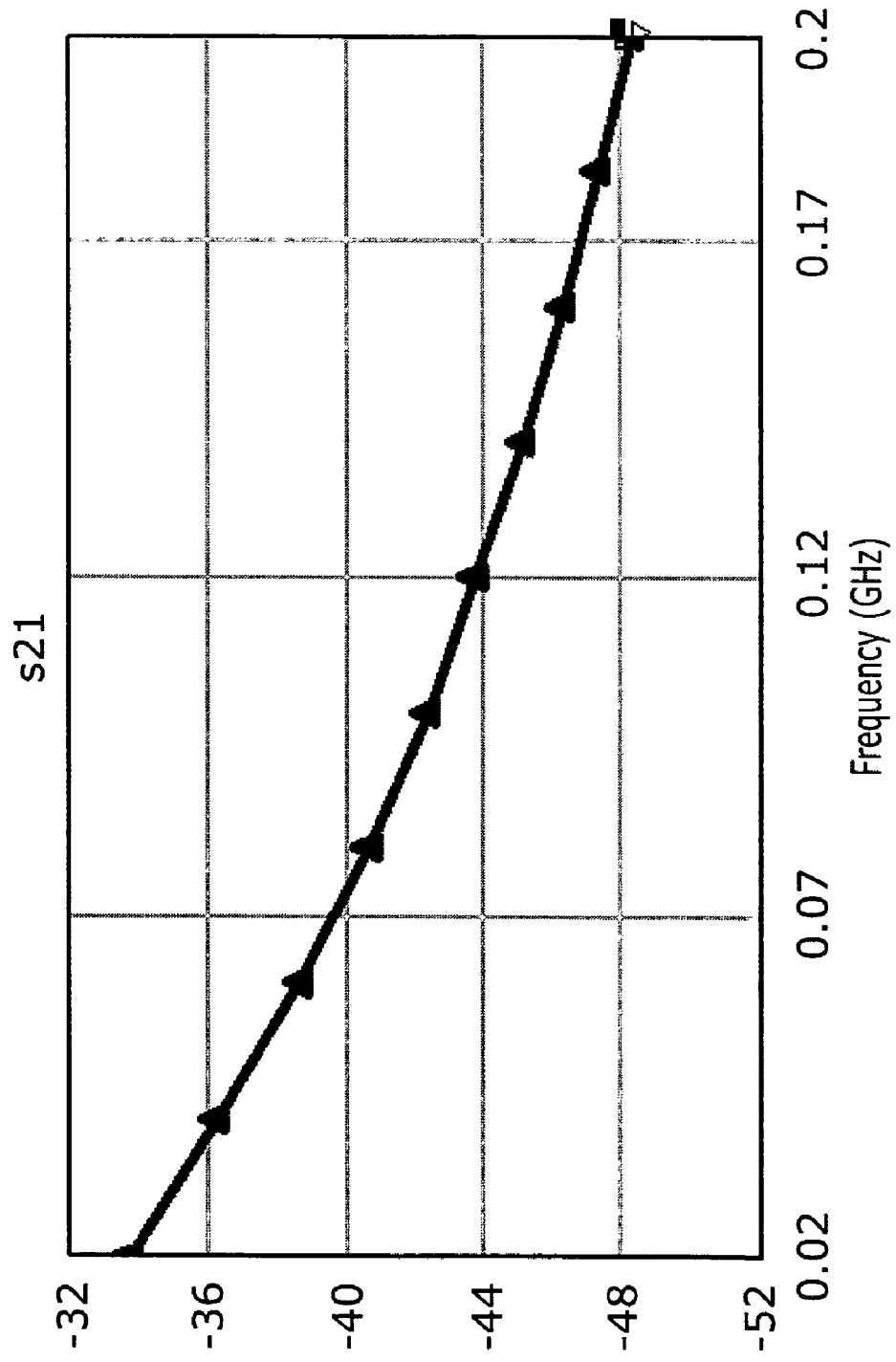
FIGS. 10-13 graphically illustrate simulation results for the circuit of FIG. 9.
Figure 11:
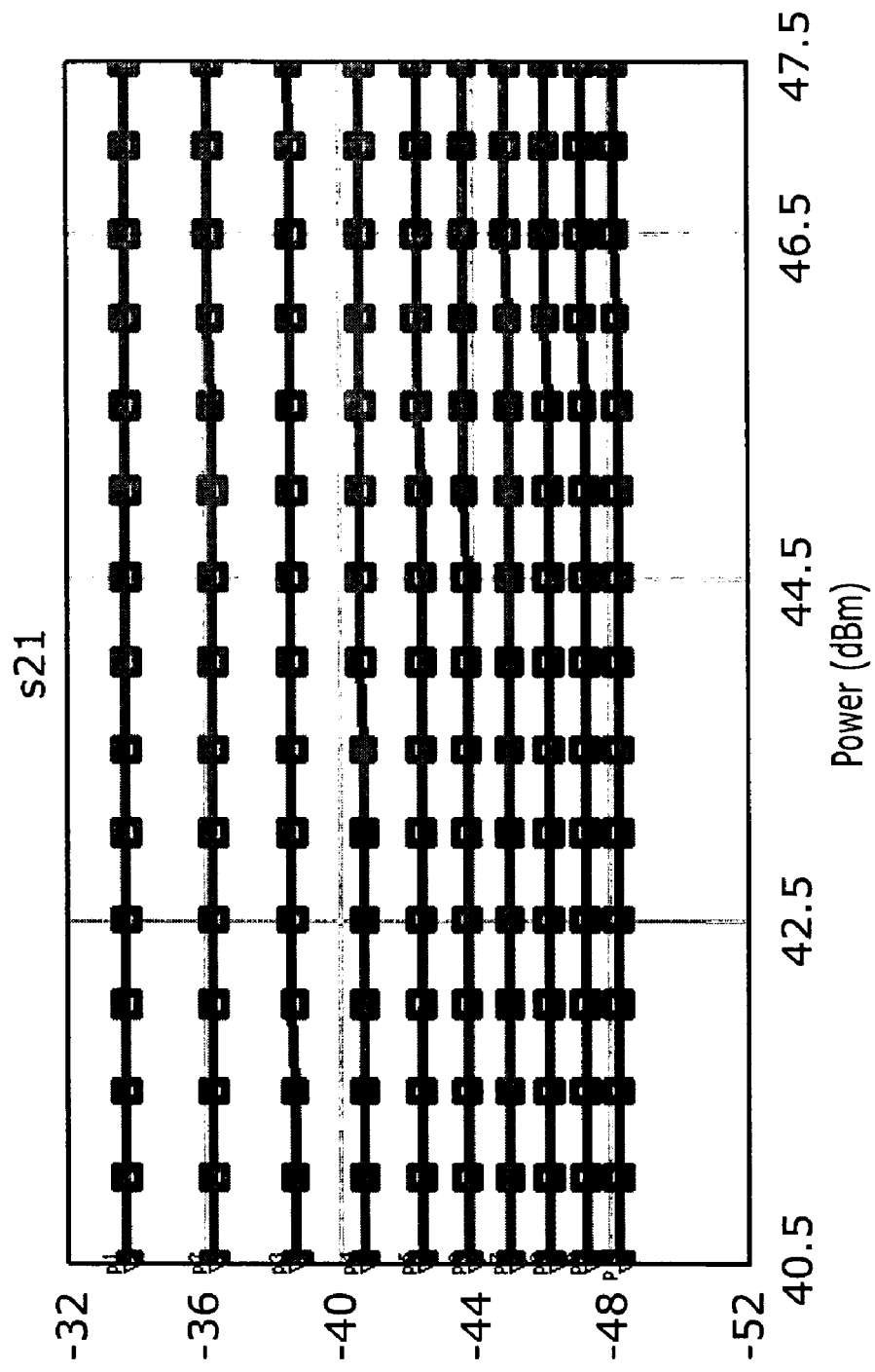
Figure 12:
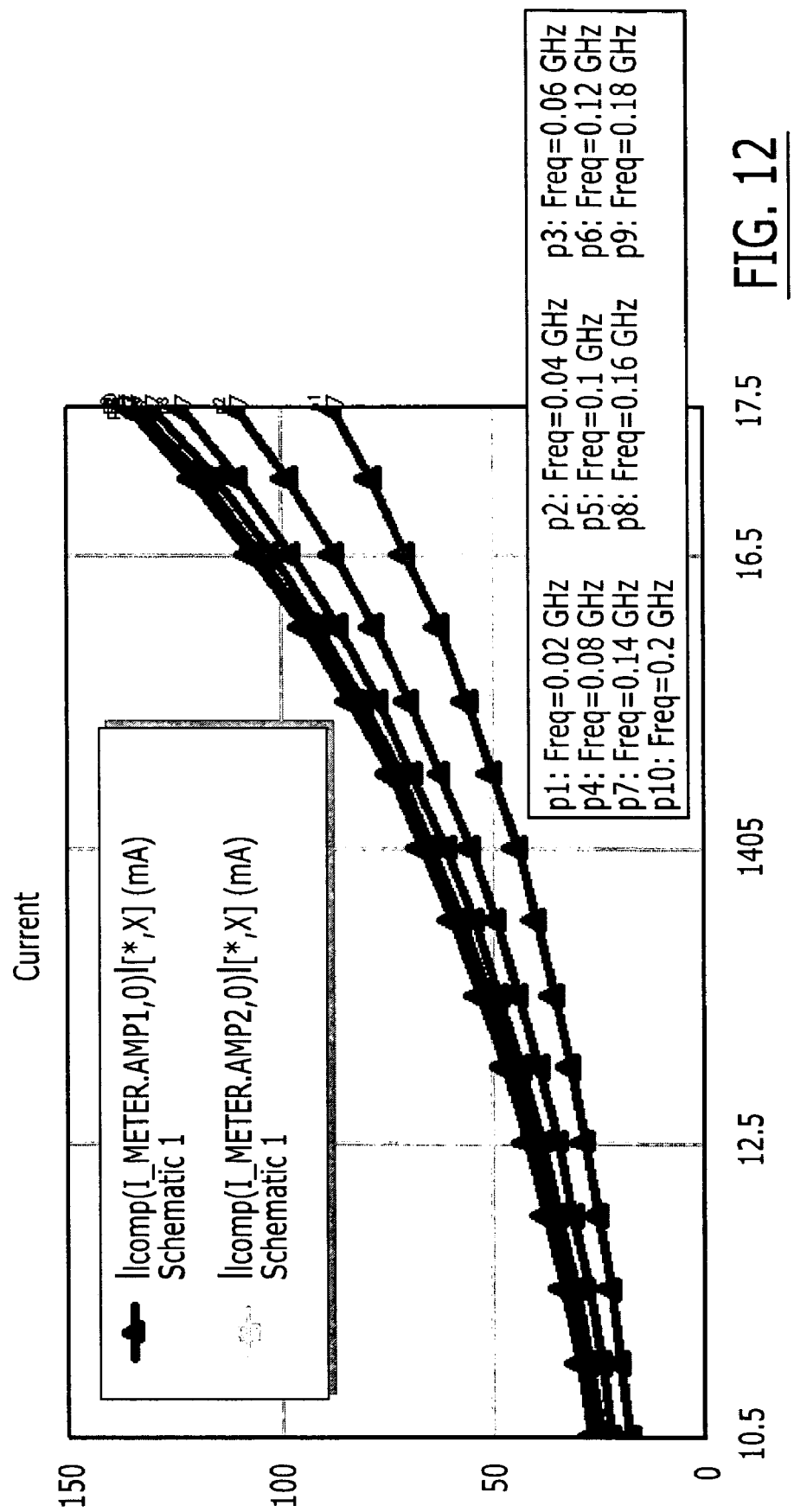
Figure 13:
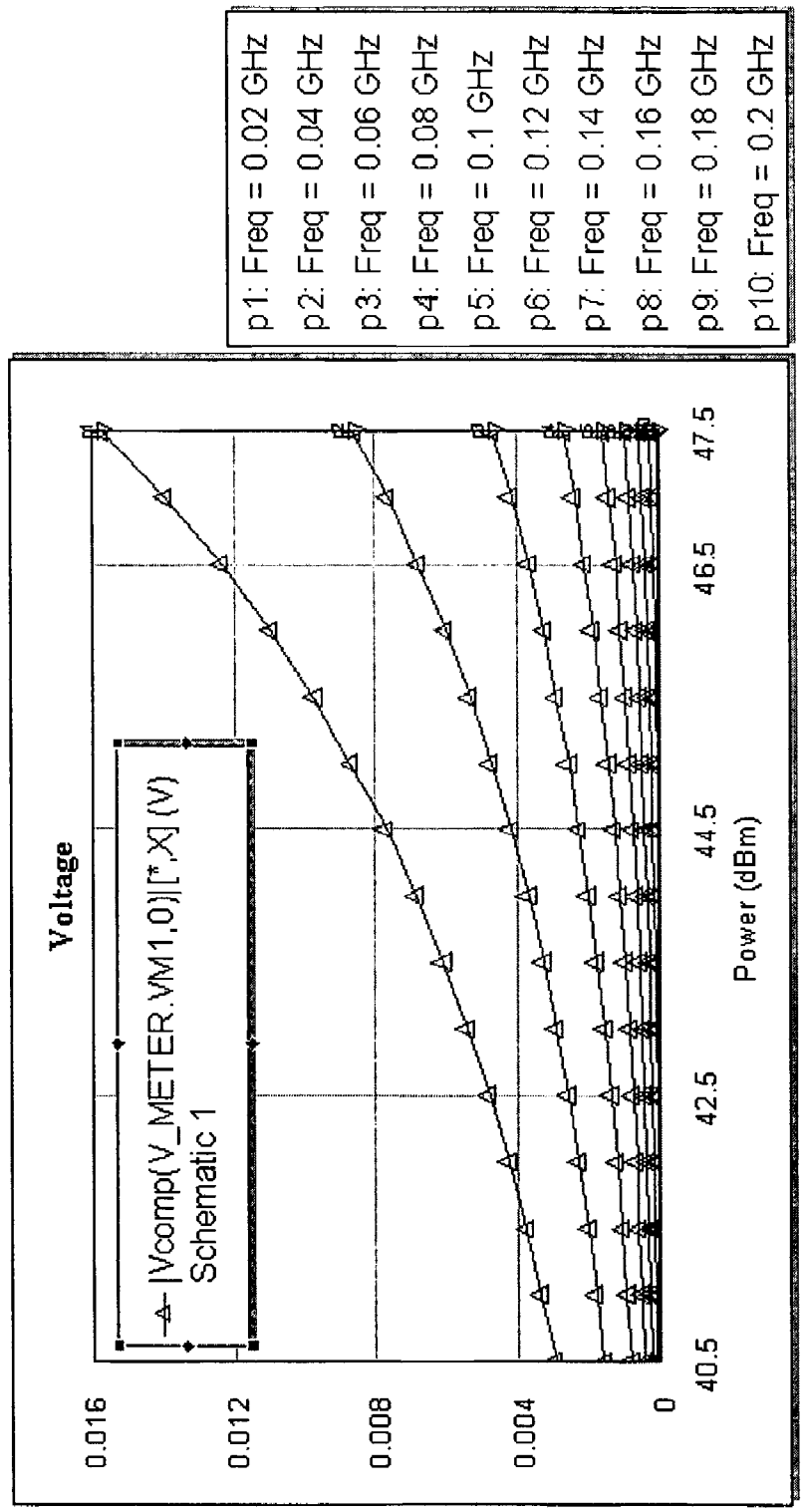

FIG. 9 is a circuit simulation of the switch of FIG. 4 in the "off" state, where the power supply voltage VDD is switched to 0 V and the gate-to-source voltage corresponding to the switch control input 160 is switched to 2 V. FIG. 10 graphically illustrates simulated small signal insertion loss in the "off" state, and FIG. 11 illustrates simulated loss in the "off" state versus RF input power as a function of frequency. FIG. 12 illustrates simulated DC current in the "off" state versus RF input power and frequency. Finally, FIG. 13 illustrates the simulated voltage at the stacked FET nodes in the switch "off" state.

Accordingly, FIGS. 4-13 simulate some embodiments of the present invention that can provide at least 50 watts of power handling at less than 0.25 dB compression, an isolation of at least 32 dB and an effective on resistance of at least 0.5 ohm over a frequency range from about 20 MHz to about 200 MHz.

Example 2

FIGS. 14-23 simulate a second embodiment of a high power, high frequency silicon carbide MESFET switch that is capable of at least 50 watts power handling at less than about 0.3 dB compression, an isolation of at least 45 dB and an effective on resistance of less than 0.5 ohm over a frequency range of from about 500 MHz to about 1000 MHz. These embodiments were implemented using actual transmission lines 110" and shunt capacitors 314a, 314b, as was illustrated in FIG. 3, but with two pairs of FETs 140', 250; and 142', 252 to absorb drain-to-source capacitance in shunt mode approach, as was illustrated in FIG. 2. Stacked bare die FETs may be used to increase or maximize power handling.

Figure 14:
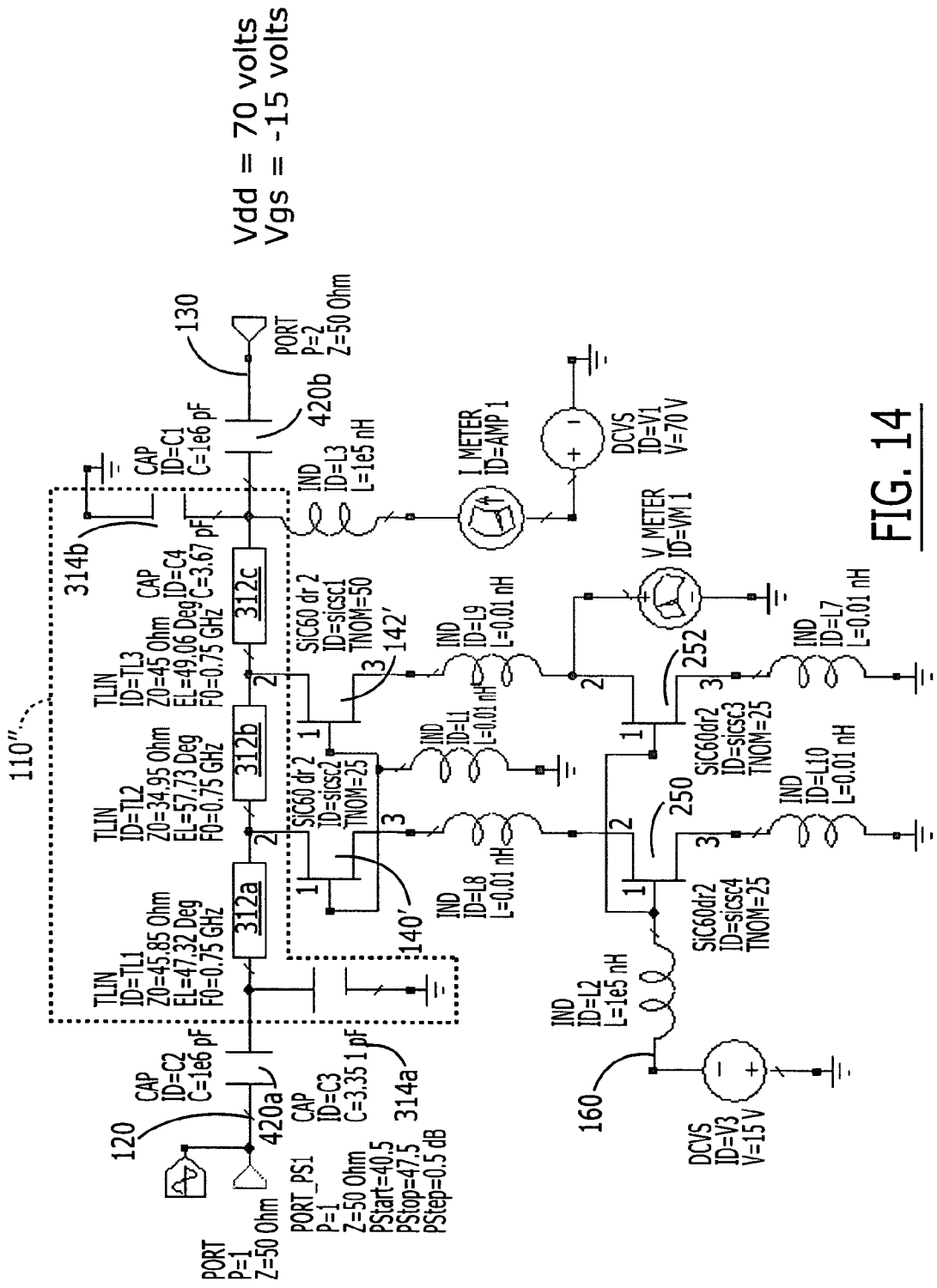
FIG. 14 is a circuit simulation of a high power, high frequency switch according to other embodiments of the present invention in the "on" state.

FIG. 14 illustrates a simulation of this embodiment in the "on" state. Like numbers with FIGS. 2 and 3 are used. In the "on" state, a power supply voltage of 70 V and a control signal voltage 160 of –15 V is used.

Figure 15:
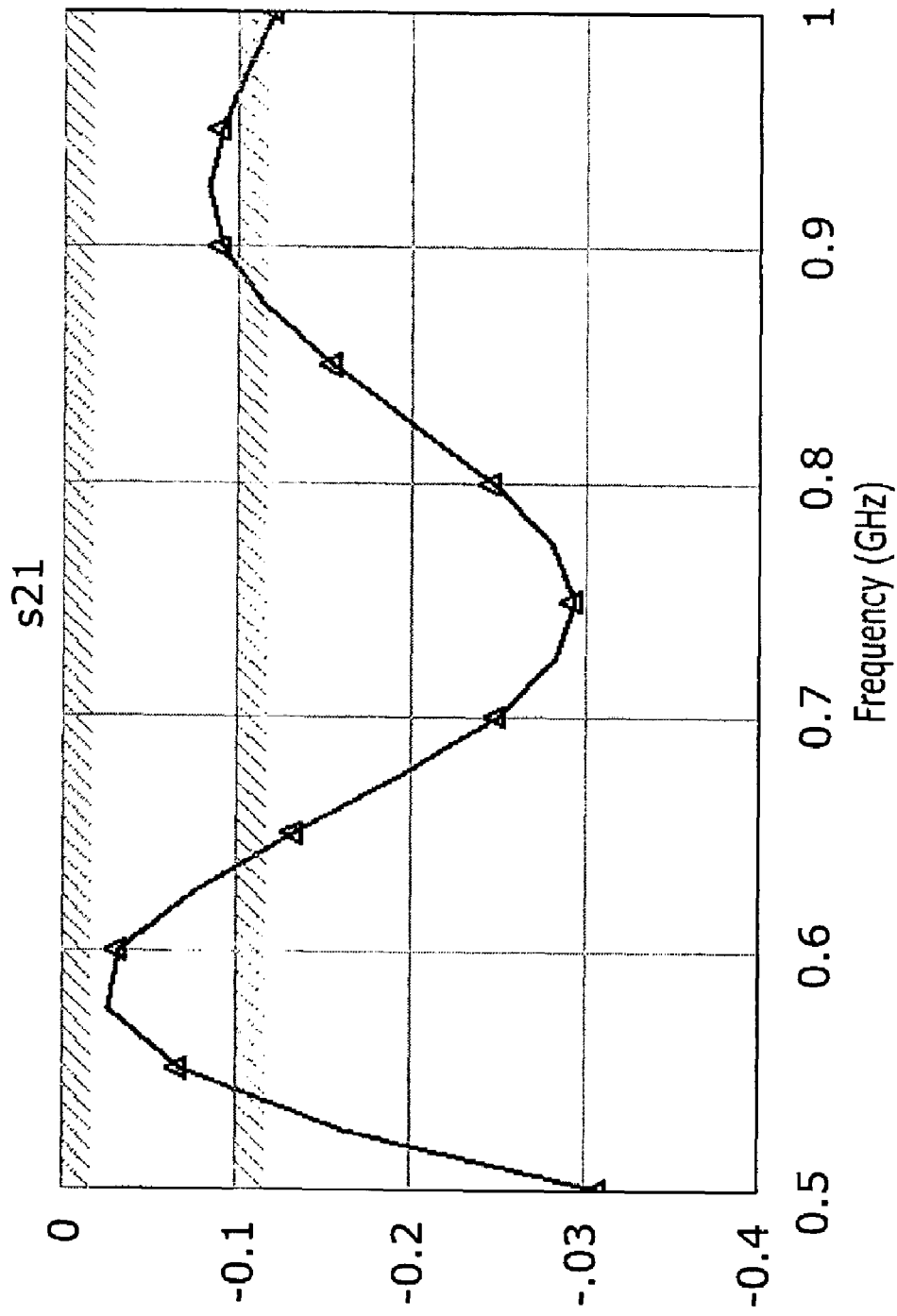
FIGS. 15-18 graphically illustrate simulation results for the circuit of FIG. 14.
Figure 16:
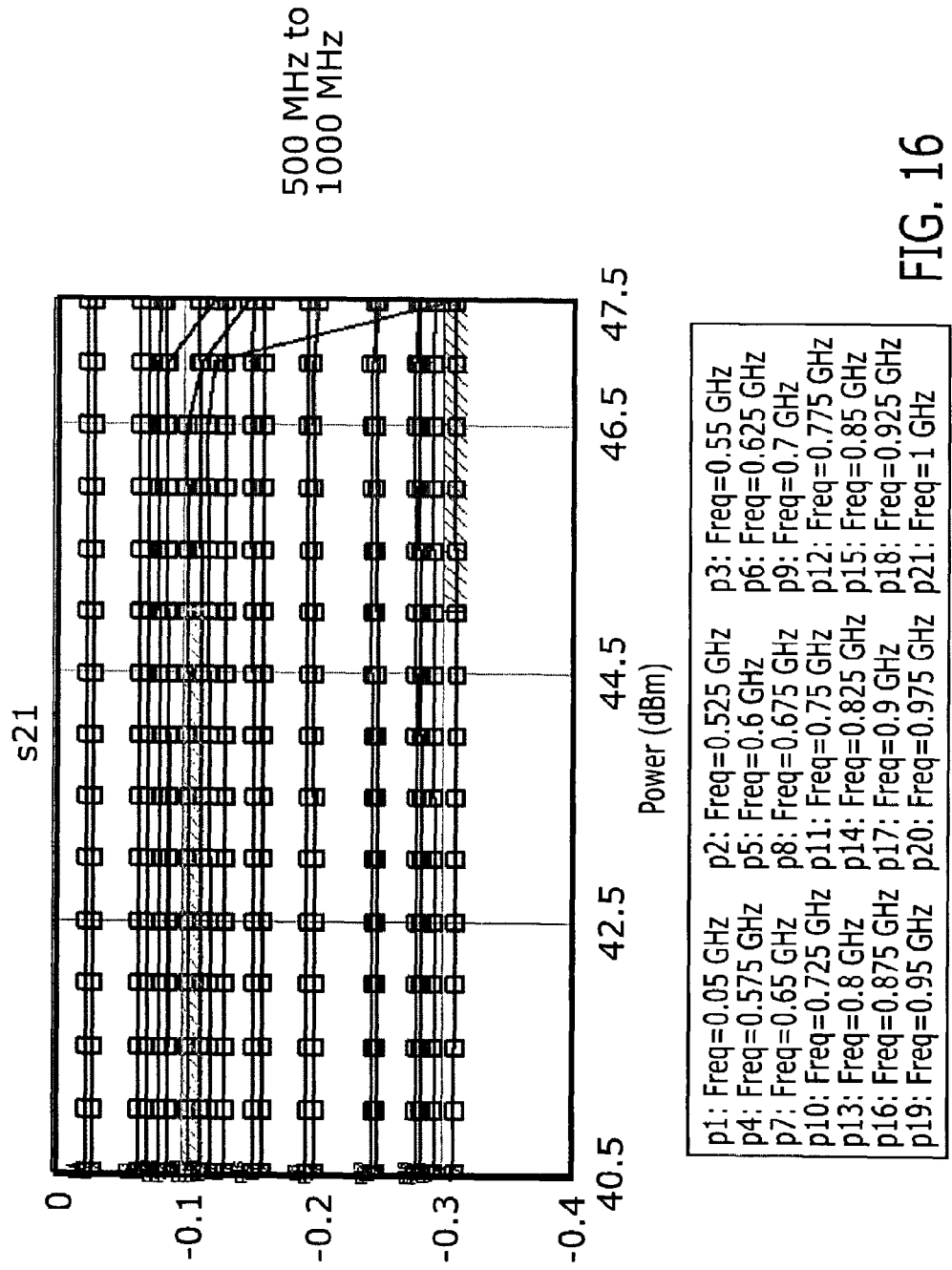
Figure 17:
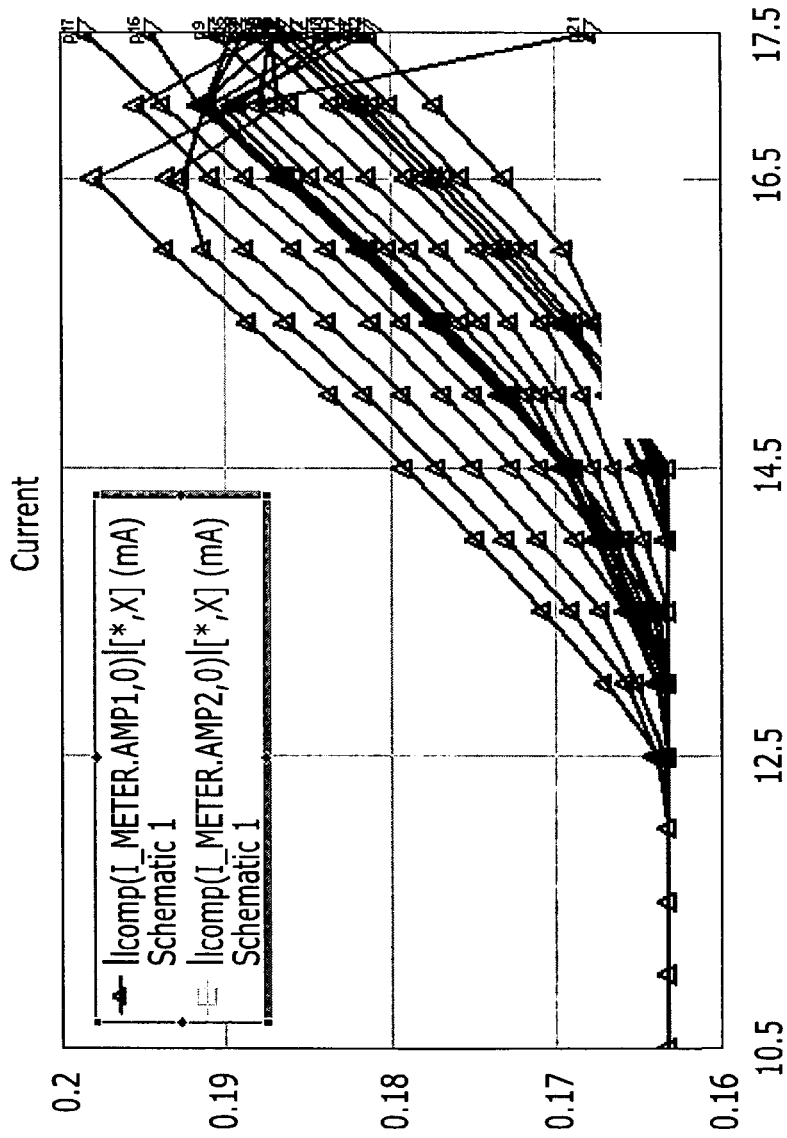
Figure 18:
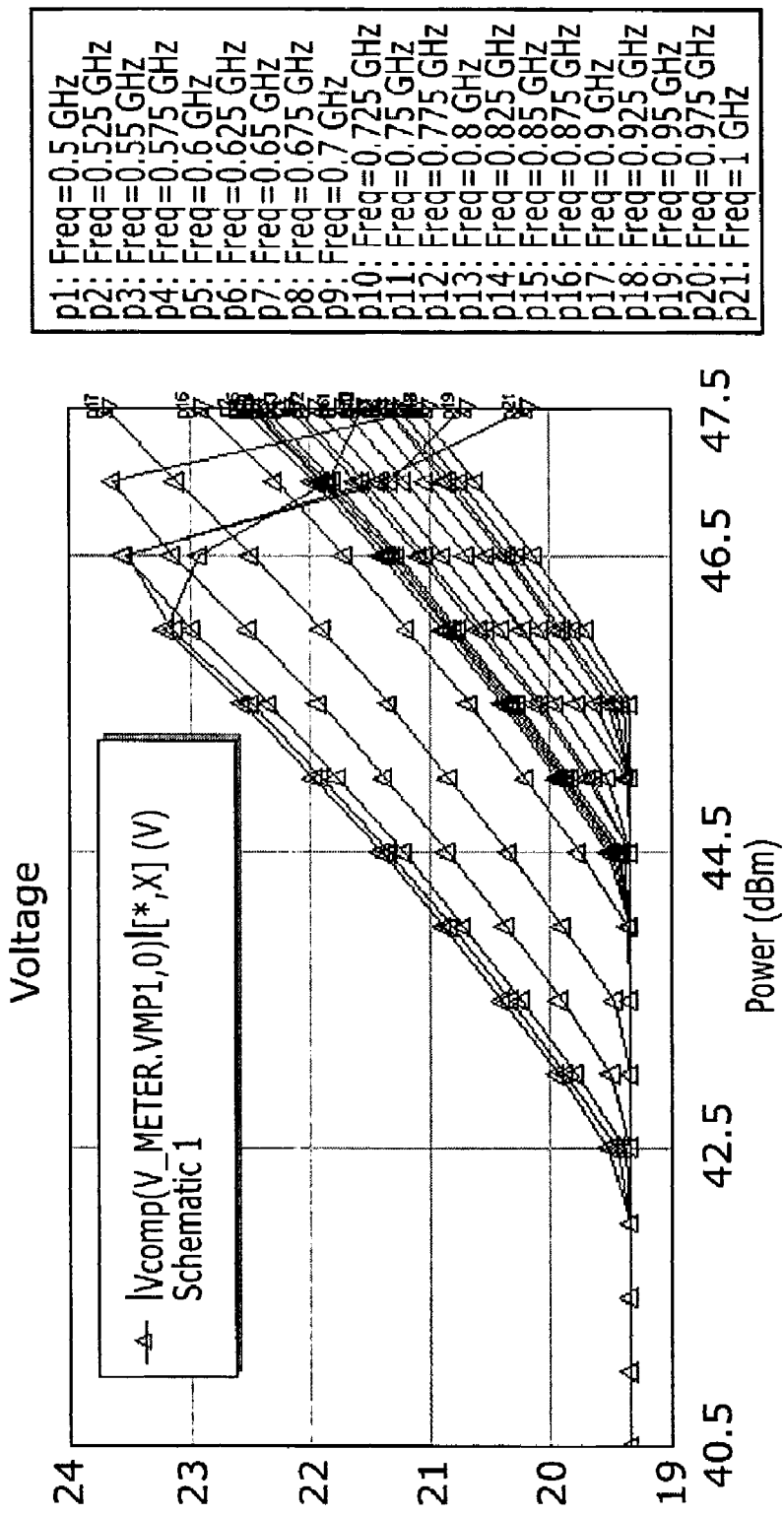

FIG. 15 illustrates the simulated small signal insertion loss in the "on" state which is shown to be less than about 0.3 dB. FIG. 16 illustrates simulated loss in the "on" state versus RF input power as a function of frequency. FIG. 17 illustrates simulated DC current in the "on" state versus RF input power and frequency. FIG. 18 illustrates simulated voltage at the stacked FET nodes in the "on" state, and shows voltage across the grounded gate FETs of less than 50 volts.

Figure 19:
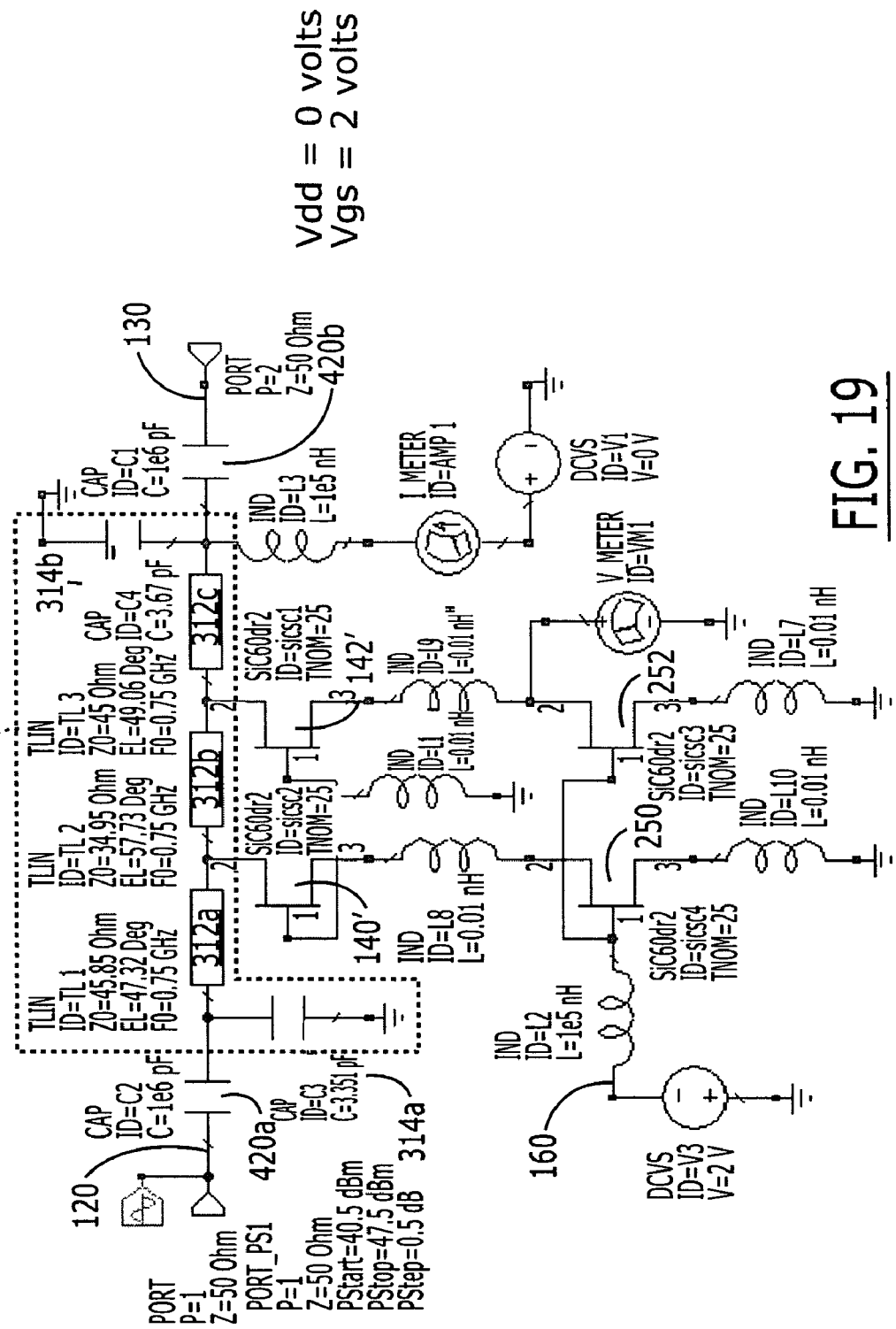
FIG. 19 is a circuit simulation of a high power, high frequency switch according to other embodiments of the present invention in the "off" state.

FIG. 19 simulates embodiments of FIG. 14 in the "off" state, where a power supply voltage of 0 V and a control signal voltage of 2 V is provided.

Figure 20:
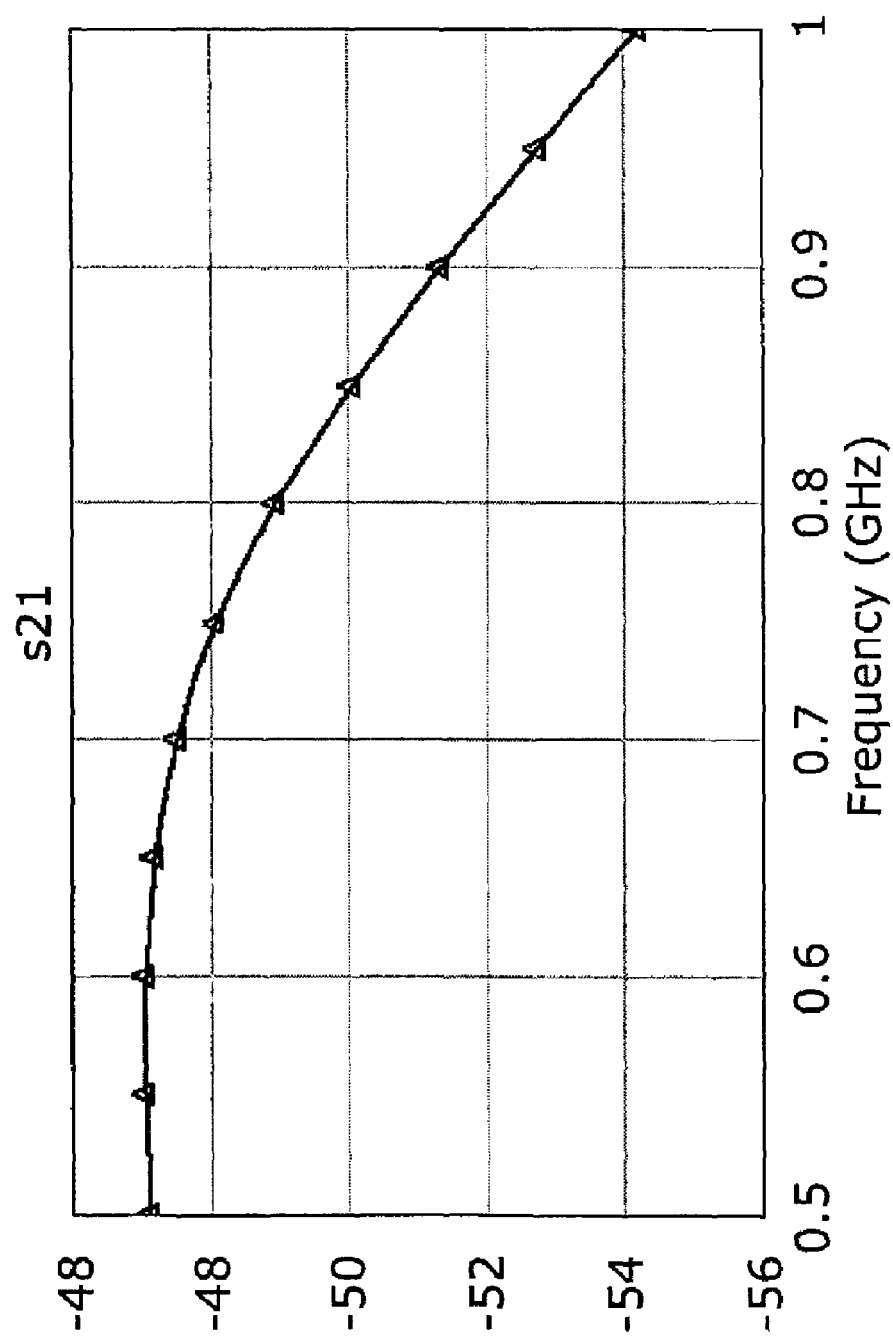
FIGS. 20-23 graphically illustrate simulation results for the circuit of FIG. 19.
Figure 21:
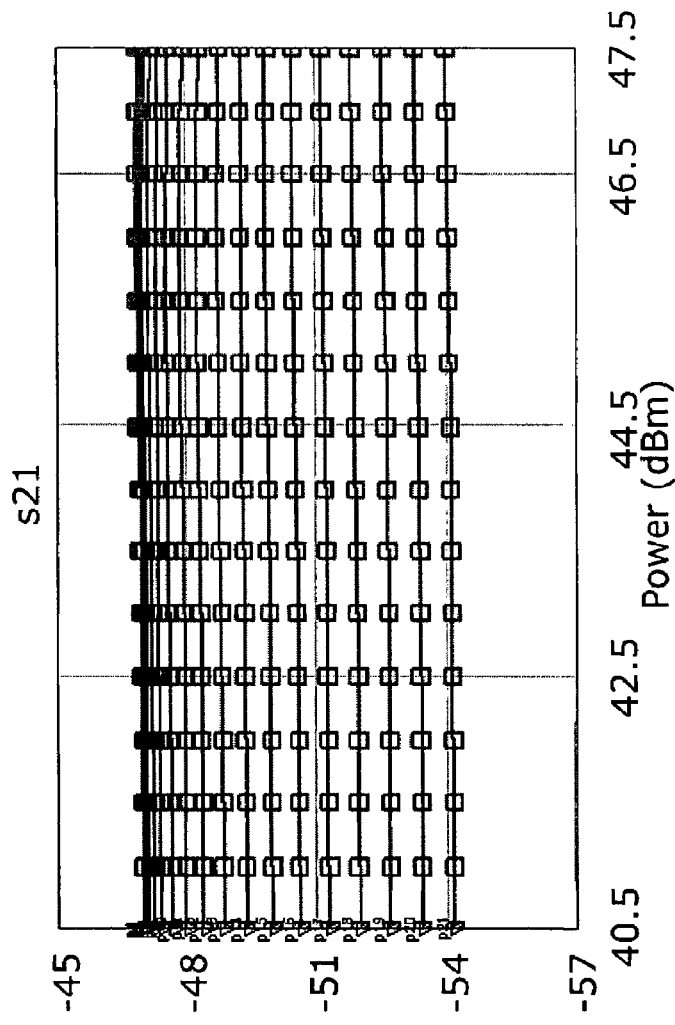
Figure 22:
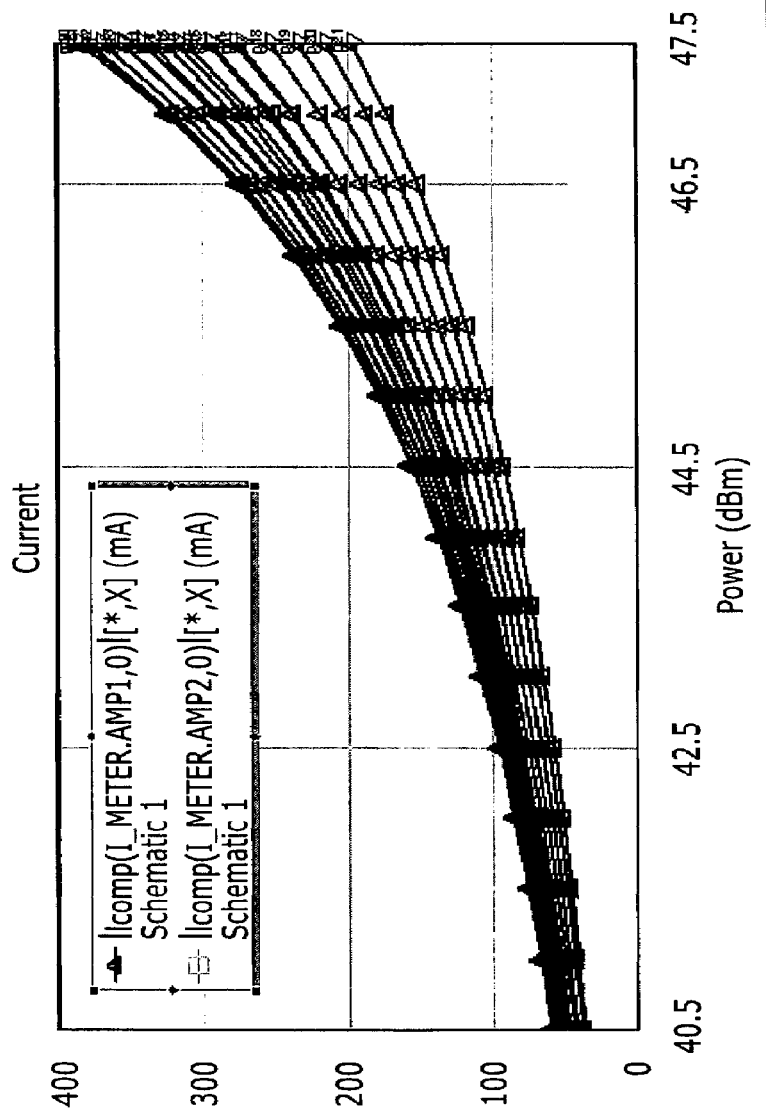
Figure 23:
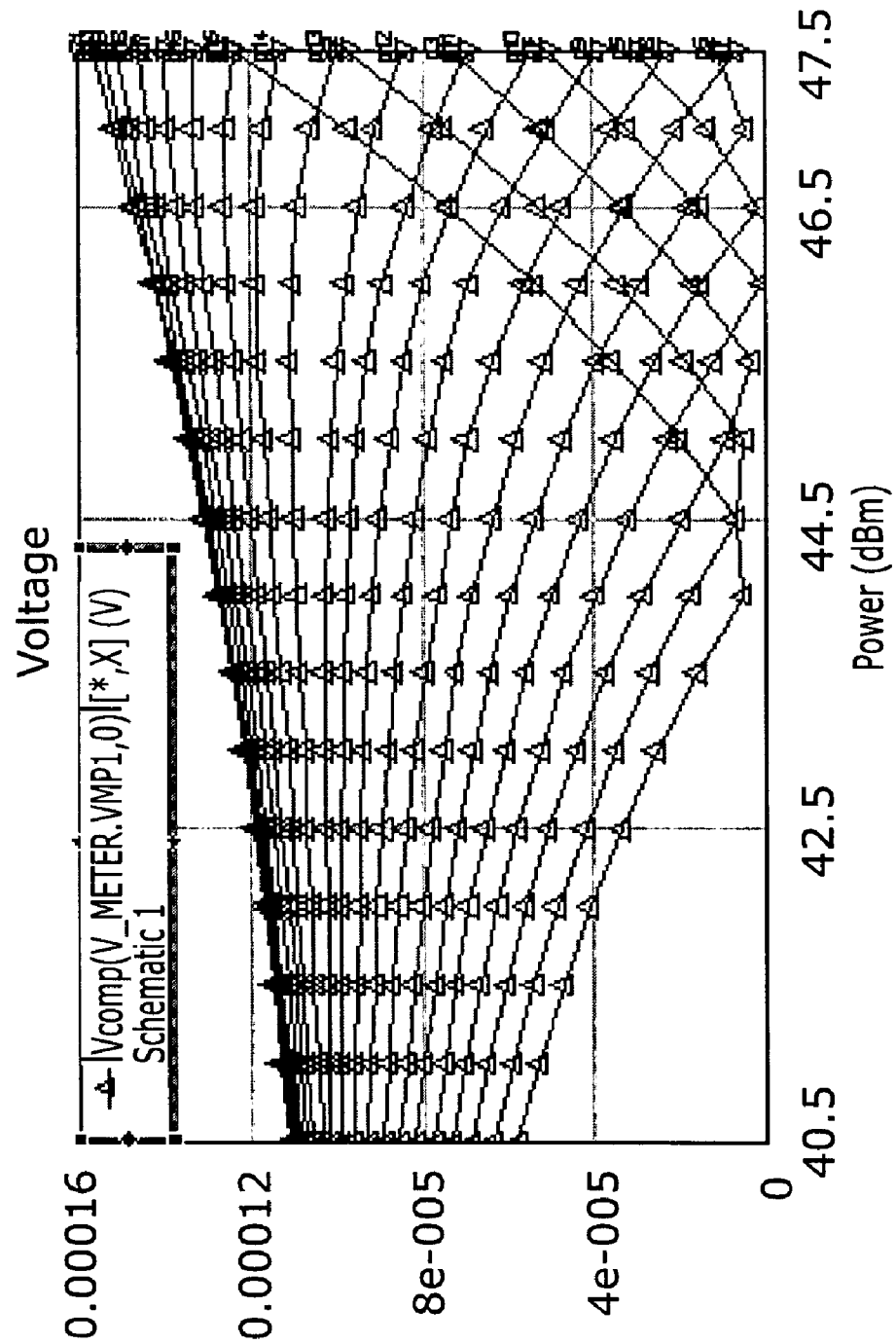

FIG. 20 graphically illustrates simulated small signal insertion loss in the "off" state. FIG. 21 illustrates simulated loss in the "off" state versus RF input power as a function of frequency. FIG. 22 illustrates simulated DC current in the "off" state versus RF input power and frequency. FIG. 23 illustrates simulated voltage at the stacked FET nodes in the switch "off" state.

Accordingly, FIGS. 14-23 simulate some embodiments of the invention that can provide at least 50 watts of power handling at less than 0.3 dB compression, an isolation of at least 45 dB and an effective on resistance of less than 0.5 ohm over a frequency range from about 500 MHz to about 1000 MHz.

Figure 24:
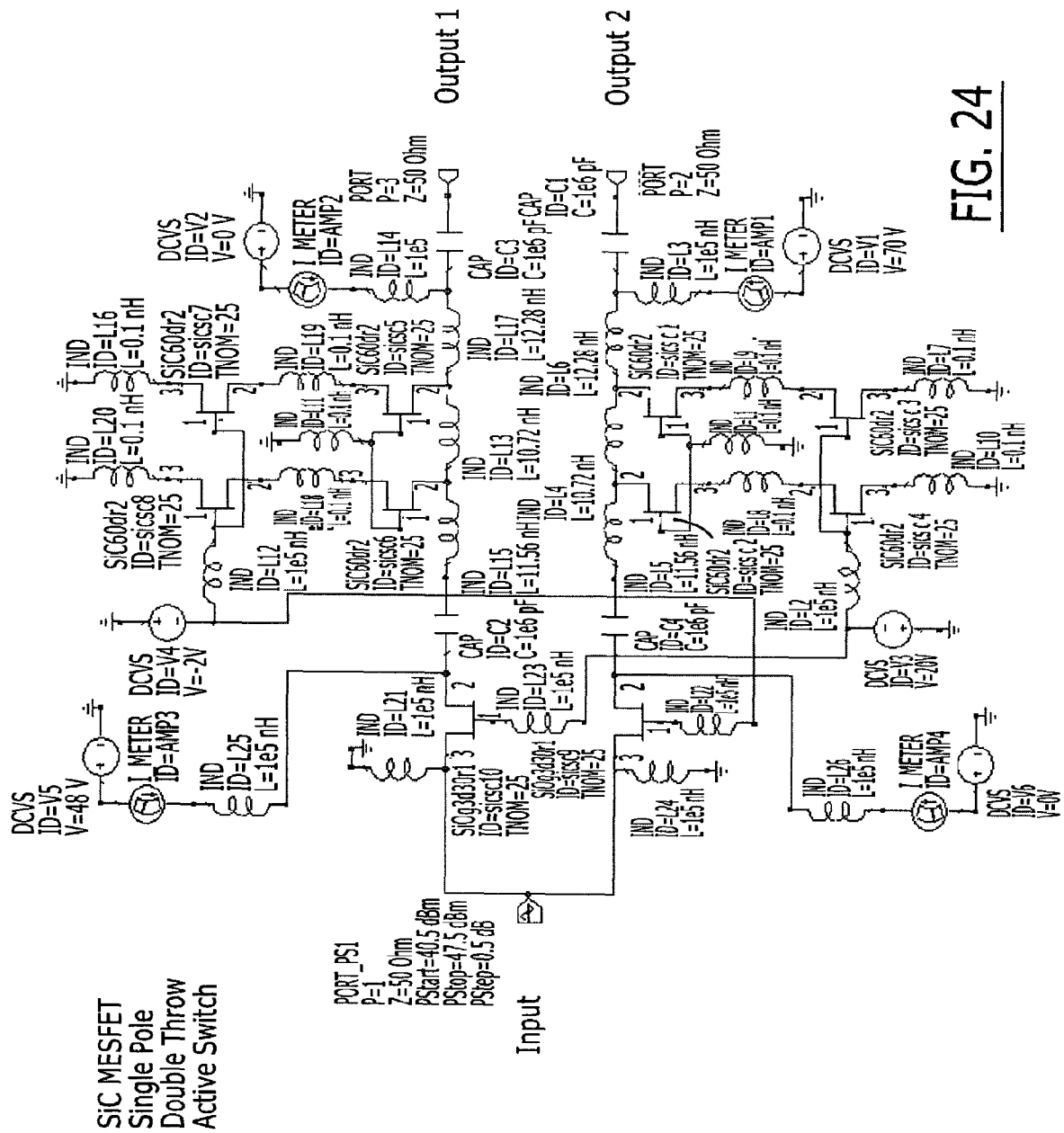
FIG. 24 is a circuit simulation of a single pole/double throw switch according to other embodiments of the present invention.

Finally, embodiments of the present invention have been described above in connection with single pole/single throw switches. However, embodiments of the present invention can be used for more complex switches with more poles/throws, such as a single pole/double throw switch. A schematic diagram of a simulated single pole/double throw switch is illustrated in FIG. 24.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A high power, high frequency switch comprising:
   a transmission line including at least three portions that are serially coupled between an input port and an output port to define at least two nodes therebetween, and to carry a high power, high frequency signal between the input port and the output port, the at least two nodes being configured to be biased with a DC bias voltage;

a first DC blocking capacitor between the input port and the transmission line and a second DC blocking capacitor between the transmission line and the output port;

first and second power transistors including a controlling electrode and controlled electrodes; and at least a third power transistor including a controlling electrode and controlled electrodes, the controlled electrodes of a respective one of the first and second power transistors and of a respective one of the at least a third power transistor being serially coupled between a respective one of the at least two nodes and a reference voltage, the controlling electrodes of the first, second and/or at least a third power transistor being responsive to a switch control signal at a switch control input.

2. A switch according to claim 1 wherein the at least a third power transistor comprises a third and a fourth power transistor, the controlled electrodes of the first and third power transistors being serially connected between the first node and the reference voltage and the controlled electrodes of the second and fourth power transistors being serially connected between the second node and the reference voltage.

3. A switch according to claim 1 wherein the at least a third power transistor consists of a third power transistor, the controlled electrodes of a respective one of the first and second power transistors and the third power transistor being serially coupled between the respective one of the at least two nodes and the reference voltage.

4. A switch according to claim 1 wherein the first, second and the at least a third power transistor are operable to shunt the first and second nodes to the reference voltage and to decouple from the nodes in response to the switch control signal.

5. A switch according to claim 1 wherein the transmission line comprises at least three transmission line portions.

6. A switch according to claim 1 wherein the transmission line comprises distributed series inductors and distributed shunt capacitors.

7. A switch according to claim 6 wherein the shunt capacitors comprise parasitic capacitance.

8. A switch according to claim 1 wherein the controlling electrodes of the first and second power transistors are coupled to the reference voltage and wherein the controlling electrodes of the at least a third power transistor are coupled to the switch control signal.

9. A switch according to claim 1 wherein the first, second and the at least a third power transistors are silicon carbide MESFETs.

10. A switch according to claim 1 wherein the transmission line and the first, second and the at least a third power transistors are configured to provide at least 50 watts of power handling at less than 0.25 dB compression, an isolation of at least 32 dB and an effective on resistance of less than 0.5 ohm over a range from about 20 MHz to about 200 MHz.

11. A switch according to claim 1 wherein the transmission line and the first, second and the at least a third power transistors are configured to provide at least 50 watts of power handling at less than 0.3 dB compression, an isolation of at least 45 dB and an effective on resistance of less than 0.5 ohm over a range from about 500 MHz to about 1000 MHz.

12. A high power, high frequency switch comprising:

a signal line that carries a high power, high frequency signal between an input port and an output port; and a plurality of strings of serially connected power transistors, each of which includes a controlling electrode and controlled electrodes, the controlled electrodes of a respective string of serially connected power transistors being serially connected between the signal line and a reference voltage, at least one controlling electrode in a respective string being connected to the reference voltage, and at least one controlling electrode in a respective string being responsive to a switch control signal.

13. A switch according to claim 12 wherein plurality of strings of serially connected power transistors are operable to shunt the signal line to the reference voltage and to decouple from the signal line in response to the switch control signal.

14. A switch according to claim 12 wherein the signal line comprises a transmission line.

15. A switch according to claim 12 wherein the power transistors comprise silicon carbide MESFETs.

16. A switch according to claim 12 wherein the plurality of strings of serially connected power transistors are configured to provide at least 50 watts of power handling at less than 0.25 dB compression, an isolation of at least 32 dB and an effective on resistance of less than 0.5 ohm over a range from about 20 MHz to about 200 MHz.

17. A switch according to claim 12 wherein the plurality of strings of serially connected power transistors are configured to provide at least 50 watts of power handling at less than 0.3 dB compression, an isolation of at least 45 dB and an effective on resistance of less than 0.5 ohm over a range from about 500 MHz to about 1000 MHz.

18. A high power, high frequency switch comprising:

a signal line that carries a high power, high frequency signal between an input port and an output port; and a plurality of power transistors that are connected to the signal line and are responsive to a switch control signal, the plurality of power transistors including first, second and third power transistors, each of which includes a controlling electrode and controlled electrodes, the controlled electrodes of the first and third power transistors being serially connected between the signal line and a reference voltage and the controlled electrodes of the second and third power transistors being serially connected between the signal line and the reference voltage.

19. A switch according to claim 18 wherein the signal line comprises a transmission line.

20. A switch according to claim 18 wherein the power transistors comprise silicon carbide MESFETs.

21. A switch according to claim 18 wherein the plurality of power transistors being operable to provide at least 50 watts of power handling at less than 0.3 dB compression, an isolation of at least 45 dB and an effective on resistance of less than 0.5 ohm over a range from about 500 MHz to about 1000 MHz.

22. A switch according to claim 18 wherein the controlling electrodes of the first and second power transistors are coupled to the reference voltage and wherein the controlling electrodes of the third power transistor are coupled to the switch control signal.

* * * * *